US008558551B2

(12) United States Patent
Mynam et al.

(10) Patent No.: US 8,558,551 B2

(45) **Date of Patent: *Oct. 15, 2013**

(54) FAULT LOCATION IN ELECTRIC POWER DELIVERY SYSTEMS

(75) Inventors: Mangapathirao Venkata Mynam, Pullman, WA (US); Yanfeng Gong, Pullman, WA (US); Armando Guzman-Casillas, Pullman, WA (US)

(73) Assignee: Schweitzer Engineering Laboratories Inc, Pullman, WA (US)

( * ) Notice: Subject to any disclaimer, the term of this patent is extended or adjusted under 35 U.S.C. 154(b) by 315 days.

This patent is subject to a terminal disclaimer.

(21) Appl. No.: 13/154,700

(22) Filed: Jun. 7, 2011

(65) Prior Publication Data

US 2011/0264389 A1 Oct. 27, 2011

Related U.S. Application Data

(63) Continuation-in-part of application No. 12/764,342, filed on Apr. 21, 2010.

(51) Int. Cl.
*G01R 31/06* (2006.01)

(52) U.S. Cl.
USPC ................ 324/522; 324/764.01; 324/765.01; 702/58; 702/59

(58) Field of Classification Search
USPC ........ 324/522, 764.01–765.01; 700/291–298; 702/58–65
See application file for complete search history.

(56) References Cited

U.S. PATENT DOCUMENTS 4,313,169 A 1/1982 Takagi
4,379,294 A 4/1983 Sutherland
4,996,624 A 2/1991 Schweitzer, III
5,140,492 A 8/1992 Schweitzer, III
5,325,061 A 6/1994 Schweitzer, III
5,367,426 A 11/1994 Schweitzer, III
5,455,776 A 10/1995 Novosel
5,808,845 A * 9/1998 Roberts .......................... 361/79
6,256,592 B1 7/2001 Roberts
6,483,435 B2 11/2002 Saha (Continued)

FOREIGN PATENT DOCUMENTS

WO 2007032697 3/2007
WO 2007110004 4/2007

(Continued)

OTHER PUBLICATIONS

X. Luo, M. Kezunovic Automated Analysis of Digital Relay Based on Expert System Jun. 2005.

(Continued)

*Primary Examiner* — Jermele M Hollington
*Assistant Examiner* — Adam Clarke
(74) *Attorney, Agent, or Firm* — Richard M. Edge; Jared L. Cherry

(57) ABSTRACT

Accurately calculating location of a phase-to-phase fault even on a branched, non-homogenous, radial electric power distribution system. The calculation includes determining a calculated reactance to the fault without using positive-sequence current measurements, and uses the line parameters to determine locations on the system that match the calculated reactance to the fault. The calculation may further include a determination of faulted phase and eliminate fault location possibilities based on absence of the faulted phase at those locations.

22 Claims, 14 Drawing Sheets

100

102 104 106 108 130 132 138 140 142 160 IED 110

(56) References Cited

U.S. PATENT DOCUMENTS

| | | | | |
|---|---|---|---|---|
| 6,525,543 | B1 | 2/2003 | Roberts | |
| 6,879,917 | B2 | 4/2005 | Turner | |
| 7,221,166 | B2 | 5/2007 | Saha | |
| 7,233,153 | B2 | 6/2007 | Altonen | |
| 7,283,915 | B2 | 10/2007 | Saha | |
| 7,345,862 | B2 | 3/2008 | Schweitzer, III | |
| 7,375,941 | B2 * | 5/2008 | Schweitzer et al. | 361/62 |
| 7,514,933 | B2 | 4/2009 | Altonen | |
| 7,728,600 | B2 | 6/2010 | Wahlroos | |
| 2003/0085715 | A1 * | 5/2003 | Lubkeman et al. | 324/509 |
| 2004/0036478 | A1 | 2/2004 | Loginov | |
| 2008/0031520 | A1 | 2/2008 | Hou | |
| 2008/0174316 | A1 | 7/2008 | Wahlroos | |
| 2008/0211511 | A1 * | 9/2008 | Choi et al. | 324/522 |
| 2008/0284447 | A1 * | 11/2008 | Wahlroos et al. | 324/522 |
| 2008/0297163 | A1 | 12/2008 | Wahlroos | |
| 2009/0150099 | A1 | 6/2009 | Balcerek | |
| 2009/0187284 | A1 | 7/2009 | Kreiss | |
| 2009/0295231 | A1 * | 12/2009 | Gaffney et al. | 307/80 |
| 2010/0013632 | A1 | 1/2010 | Salewske | |
| 2010/0053829 | A1 | 3/2010 | Selejan | |
| 2010/0102824 | A1 | 4/2010 | Tremblay | |
| 2010/0152910 | A1 | 6/2010 | Taft | |
| 2010/0179779 | A1 | 7/2010 | Taft | |
| 2010/0179780 | A1 | 7/2010 | Taft | |
| 2011/0264388 | A1 * | 10/2011 | Gong et al. | 702/58 |

FOREIGN PATENT DOCUMENTS

| | | |
|---|---|---|
| WO | 2009010169 | 1/2009 |
| WO | 2009136975 | 11/2009 |
| WO | 2010006652 | 1/2010 |

OTHER PUBLICATIONS

D.R. Sevcik, R.B. Lunsford, M. Kezunovic, Z. Galijasevic, S. Banu, T. Popovic Automated Analysis of Fault Records and Dissemination of Event Reports May 2000.

M. Kezunovic, X. Luo Automated Analysis of Protective Relay Data Jun. 6, 2005.

Mladen Kezunovic, Goran Latisko, Maja Knezev, Tomo Popovic Automation of Fault Analysis: Implementation Approaches and Related Benefits Jul. 2007.

X. Luo, M. Kezunovic Fault Analysis Based on Integration of Digital Relay and DFR Data Jun. 2005.

M. Kezunovic, M. Knezev Fault Location Using Sparse IED Recordings Nov. 2007.

Mladen Kezunovic PSerc Seminar: Integration of Operational and Non-Operational Data for Improved EMS Monitoring Nov. 18, 2008.

Mladen Kezunovic, Ergun Akleman, Maja Knezev, Ozgur Gonnen, Satish Natti Optimized Fault Location Aug. 19, 2007.

BPL Global Power SG® Rapid Fault Locator 2009.

Ratan Das Determining the Location of Faults in Distribution Systems 1998.

Hashim Hizam, P.A. Crossley Estimation of Fault Location on Radial Distribution Network Using Fault Generated Traveling Wave Signals 2007.

J. Mora, J Melendez, Marc Vinyoles, J Sanchez, Manel Castro An Overview to Fault Location Methods in Distribution System Based on Single End Measurements of Voltage and Current Mar. 31, 2004.

T.H.M. El-Fouly, C. Abbey On the Compatability of Fault Location Approaches and Distributed Generation Jul. 29, 2009.

Dan Ehrenreich Fault Location Integrated with DA Enhances MV Distribution Grid Control Jun. 13, 2006.

Fengling Han, Xinghuo Yu, Majid Al-Dabbagh, Yi Wang Fault Location in Power Distribution Networks Using Sinusoidal Steady State Analysis 2005.

Rodrigo A.F. Pereira, Mladen Kezunovic, Jose R.S. Mantovani Fault Location Algorithm for Primary Distribution Feeders Based on Voltage Sags Apr. 2009.

Ryszard Orlowski, Akhtar Kalam Fault Detection and Location on Distribution Feeders Sep. 29, 1999.

Bo-Gun Jin, Duck-Su Lee, Seung-Jae Lee, Myeon-Song Choi, Sang-Hee Kang, Bok-Shin Ahn, Nam-Sun Yoon, Ho-Yong Kim, Heung-Jae Lee Intelligent Fault Location and Diagnosis System on Radial Distribution Systems Jun. 24, 2002.

Laurentiu Nastac, Anupam Thatte Distribution System Fault Analysis, U.S. Department of Energy, Office of Electricity Delivery and Energy Reliability, FY06 Annual Program and Peer Review Meeting May 25, 2006.

Venkat Mynam Fault Location Theory for Transmission Lines 2007.

Schweitzer Engineering Laboratories, Inc. SEL-Profile Transmission Line Fault Analysis Program May 30, 2008.

Demitrios Tziouvaras, Jeff Roberts, Gabriel Benmouyal New Multi-Ended Fault Location Design for Two- or Three- Terminal Lines Nov. 1, 2004.

Karl Zimmerman, David Costello Impedance-Based Fault Location Experience Oct. 2004.

David Costello, Karl Zimmerman Distance Element Improvements—A Case Study Apr. 1, 2008.

Edmund O. Schweitzer, III, Jeff Roberts Distance Relay Element Design Apr. 1993.

J. Roberts, A. Guzman, E.O. Schweitzer, III Z=V/I Does Not Make a Distance Relay Oct. 1993.

D. Daniel Sabin, Cristiana Dimitriu, David Santiago, George Baroudi Overview of an Automatic Distribution Fault Location System May 4, 2010.

Edmund O. Schweitzer, III, David Whitehead, Armando Guzman, Yanfeng Gong, Marcos Donolo Advanced Real-Time Synchrophasor Applications Sep. 23, 2008.

Franco De Villiers, Marcos Donolo, Armando Guzman, Mani Venkatasubramanian Mitigating Voltage Collapse Problems in the Natal Region of South Africa Sep. 16, 2009.

Z.M. Radojevic, C.H. Kim, M. Popov, G. Preston, V. Terzija New Approach for Fault Location on Transmission Lines Not Requiring Line Parameters Jun. 3, 2009.

S. Lopez, J. Gomez, R. Cimadevilla, Synchrophasor Applications of the National Electric System Operator of Spain, 61st Annual Conference for Protective Relay Engineers Apr. 1, 2008.

David J. Lawrence, Luis Z. Cabeza, Lawrence T. Hochberg, Development of an Advanced Transmission Line Fault Location System Part II—Algorithm Development and Simulation, IEEE Transactions on Power Delivery, vol. 7., No. 4, Oct. 1992.

Edmund O. Schweitzer, III, Evaluation and Development of Transmission Line Fault Locating Techniques Which Use Sinusoidal Steady-State Information, 9th Annual Western Protective Relay Conference, Oct. 26-28, 1982.

T. Takagi, Y. Yamakoshi, M. Yamaura, R. Kondou, T. Matsushima, Development of a New Fault Type Locator Using the One-Terminal Voltage and Current Data, IEEE Transaction on Power Apparatus and Systems, vol. PAS-101, No. 8, Aug. 1982, pp. 2892-2898.

D. Novosel, D.G. Hart, E. Udren, J. Garitty, Unsynchronized Two-Terminal Fault Location Estimation, IEEE Transaction on Power Delivery, vol. 11, No. 1, 1996, pp. 130-138.

A. Guzman, V. Mynam, G. Zweigle, Backup Transmission Line Protection for Ground Faults and Power Swing Detection Using Synchrophasors, 34th Annual Western Protective Relay Conference, Oct. 2007.

J. Vargas, A. Guzman, J. Robles, Underground/Submarine Cable Protection Using a Negative-Sequence Directional Comparison Scheme, 1999.

Claude Fecteau, Accurate Fault Location Algorithm for Series Compensated Lines Using Two-Terminal Unsynchronized Measurements and Hydro-Quebec's Field Experience, Research Institute of Hydro-Quebec, 33rd Annual Western Protective Relay Conference, Oct. 17-19, 2006.

Siemens, Oscop P Fault Locator, Manual, Mar. 2007.

(56) References Cited

OTHER PUBLICATIONS

S.E. Zocholl, Three-Phase Circuit Analysis and the Mysterious k0 Factor, 22nd Annual Western Protective Relay Conference, Oct. 24-26, 1995.
PCT International Search Report and Written Opinion of the International Searching Authority for PCT/US2011/029443, May 31, 2011.

Yanfeng Gong, Armando Guzman, Distribution Feeder Fault Location Using IED and FCI Information, 2011 Texas A&M Conference for Protective Relay Engineers, Feb. 8, 2011.

Yanfeng Gong, Mangapathirao Mynam, Armando Guzman, Gabriel Benmouyal, Boris Shulim, Real-Time Multiterminal Fault Location System for Transmission Networks, Sep. 7, 2010.

* cited by examiner

FAULT LOCATION IN ELECTRIC POWER DELIVERY SYSTEMS

RELATED APPLICATION

This application is a Continuation-in-part of U.S. patent application Ser. No. 12/764,342, filed on 21 Apr. 2010, titled "Fault Location in Electric Power Delivery Systems" naming Yanfeng Gong and Armando Guzman-Casillas as inventors, which is hereby incorporated by reference in its entirety.

TECHNICAL FIELD

This disclosure relates to protection of electric power delivery systems. More particularly, this disclosure relates to determining fault location on an electric power delivery system.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
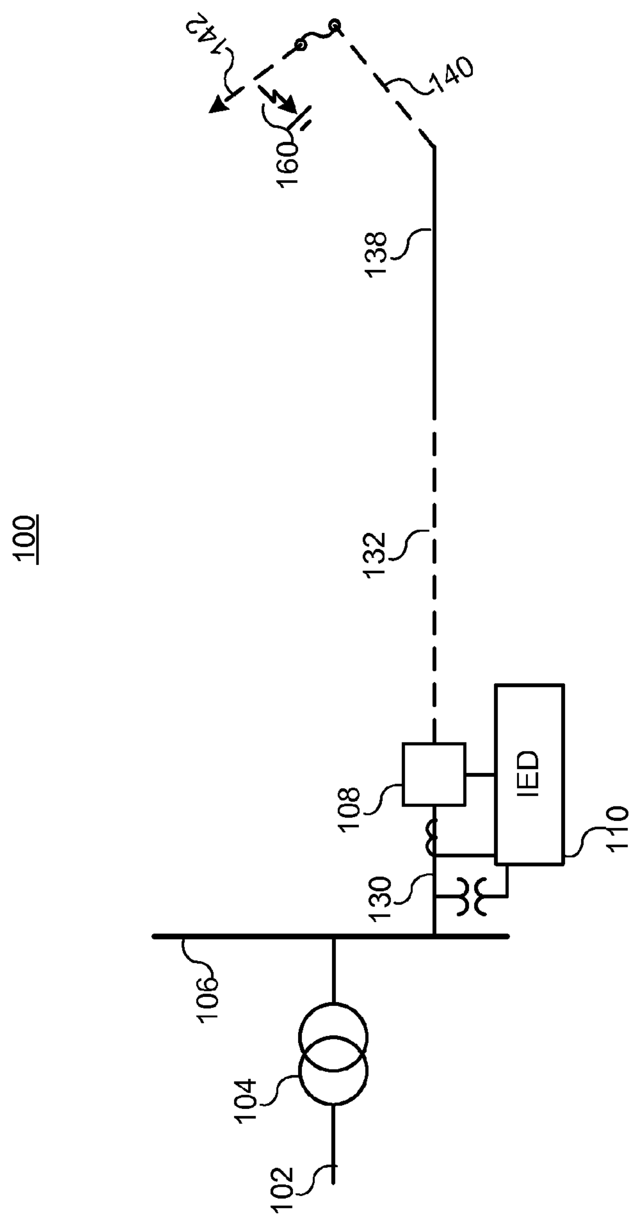
FIG. 1 illustrates a one-line diagram of an electric power delivery system.

Electric power delivery systems are designed to transmit and distribute electrical power from generation plants to loads. At times, these electric power delivery systems experience faults due to, for example, a conductive path between one (or more) of the phase conductors and ground, between two or more of the phase conductors, between one (or more) of the phase conductors and a neutral conductor, and the like. Faults can cause disruptions to the flow of power in the electric power delivery system, and may even result in the failure of the system to effectively deliver power to loads.

Owners and operators of electric power delivery systems desire to know the location of the fault on the electric power delivery system, so that the system can be repaired or modified to clear the fault or decrease the likelihood of similar future faults. As many electric power delivery systems include electric power lines that are quite long or include several segments of buses and feeders, locating a fault by traveling a path of the delivery system can be both time consuming and expensive. Accordingly, methods have been devised to calculate the distance to the fault along the electric power delivery system using measurements taken from the electric power delivery system.

Electric power delivery systems may be of a "radial" configuration under normal operating conditions in that they have a single power supply. It should be noted that the single supply may include several sources. Further, the electric power delivery system may include interconnections to other electric power delivery systems and/or supplies, but these interconnections may be open until an event occurs such as the single supply becoming unavailable, a fault on the system, a reconfiguration event, or the like. Certain figures included herein illustrate one-line diagrams of electric power delivery systems, each of which are illustrated in a radial configuration.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures, or operations are not shown or described in detail. Furthermore, the described features, structures, or operations may be combined in any suitable manner in one or more embodiments. It will also be readily understood that the components of the embodiments, as generally described and illustrated in the figures herein, could be arranged and designed in a wide variety of different configurations.

Reference throughout this specification to "one embodiment" or "an embodiment" indicates that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. In particular, an "embodiment" may be a system, an article of manufacture (such as a computer readable storage medium), a method, and a product of a process.

The phrases "connected to," "networked," and "in communication with" refer to any form of interaction between two or more entities, including mechanical, electrical, magnetic, and electromagnetic interaction. Two components may be connected to each other even though they are not in direct physical contact with each other and even though there may be intermediary devices between the two components.

Several aspects of the embodiments described will be illustrated as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network. The software modules described herein tangibly embody a program, functions, and/or instructions that are executable by computer(s) to perform tasks as described herein. Suitable software, as applicable, may be readily provided by those of skill in the pertinent art(s) using the teachings presented herein and programming languages and tools, such as XML, Java, Pascal, C++, C, database languages, APIs, SDKs, assembly, firmware, microcode, and/or other languages and tools.

Some of the infrastructure that can be used with embodiments disclosed herein is already available, such as: general-purpose computers, computer programming tools and techniques, digital storage media, and optical networks. A computer may include a processor such as a microprocessor, microcontroller, logic circuitry, or the like. The processor may include a special purpose processing device such as an ASIC, PAL, PLA, PLD, Field Programmable Gate Array, or other customized or programmable device. The computer may also include a computer readable storage device such as non-volatile memory, static RAM, dynamic RAM, ROM, CD-ROM, disk, tape, magnetic, optical, flash memory, or other computer readable storage medium.

As used herein, the term IED may refer to any microprocessor-based device that monitors, controls, automates, and/or protects monitored equipment within the system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. IEDs may be connected to a network, and communication on the network may be facilitated by networking devices including, but not limited to, multiplexers, routers, hubs, gateways, firewalls, and switches. Furthermore, networking and communication devices may be incorporated in an IED or be in communication with an IED. The term IED may be used interchangeably to describe an individual IED or a system comprising multiple IEDs.

Many electric power delivery systems are not homogeneous. That is, power line segments may not have identical physical parameters. Segments of certain electric power delivery systems may have conductors of different diameters, ratings, materials, and the like. Further, electric power delivery systems may be branched and not have IEDs located at each end of every branch, or on each segment of each branch. Electric power distribution systems, for example, typically have multiple branches and conform to residential and industrial preferences of the location of the conductors (e.g. overhead or underground). Accordingly, such systems are not homogeneous and may not have IEDs at each end or on each branch, complicate the task of locating the fault on the system.

Calculating the distance to the fault is more accurate when the line parameters are homogeneous. However, as mentioned, on electric power distribution systems, line parameters between the substation and the fault may be fairly non-homogeneous. FIG. 1 illustrates a one-line diagram of a typical electric power delivery system 100 with non-homogeneous line parameters. The electric power delivery system 100 has underground segments indicated in dashed-line and overhead segments indicated in solid line. The system 100 includes a line 102 from a source, such as generation, transmission system, or the like, feeding a transformer 104 that may be a step-up transformer (such as in the case where source is generation) or a step-down transformer (in the case where the source is a transmission line and the delivery system 100 is a distribution system) in connection with bus 106. Line 130 (which may be a distribution feeder, transmission line, or the like) is connected to the downstream distribution system via breaker 108. Line 130 is monitored by IED 110, which gathers power system information, such as voltage, current, frequency, and the like from line 130 via a potential transformer (PT) and a current transformer (CT). IED 110 further is in communication with breaker 108, and may command breaker 108 to open if a downstream fault is detected. Line 130 may include non-homogenous portions. The illustrated line 130 includes overhead portion 138 and underground portions 132, 140, and 142.

A fault 160 may occur on portion 142 of line 130. As described below, IED 110 may attempt to calculate a distance to fault 160. The distance calculation may be based on an assumed set of line parameters. Because line parameters, such as physical characteristics of the conductors used in the electric power distribution system 100 are not homogenous, distance calculation assuming homogeneous line parameters may include errors. Further, because the electric power distribution system 100 includes several branches, a calculation of the distance to the fault may result in several possibilities of fault location (the fault calculation could point to different points on different parallel segments). To better calculate possible fault locations, the systems and methods described herein calculate a distance to the fault by determining the calculated reactance from the measuring device (such as IED 110) to the fault 160 $X_{calc}$. The reactance may then be used in conjunction with the line parameters to determine the distance to the fault even when the line is non-homogeneous.

Figure 2:
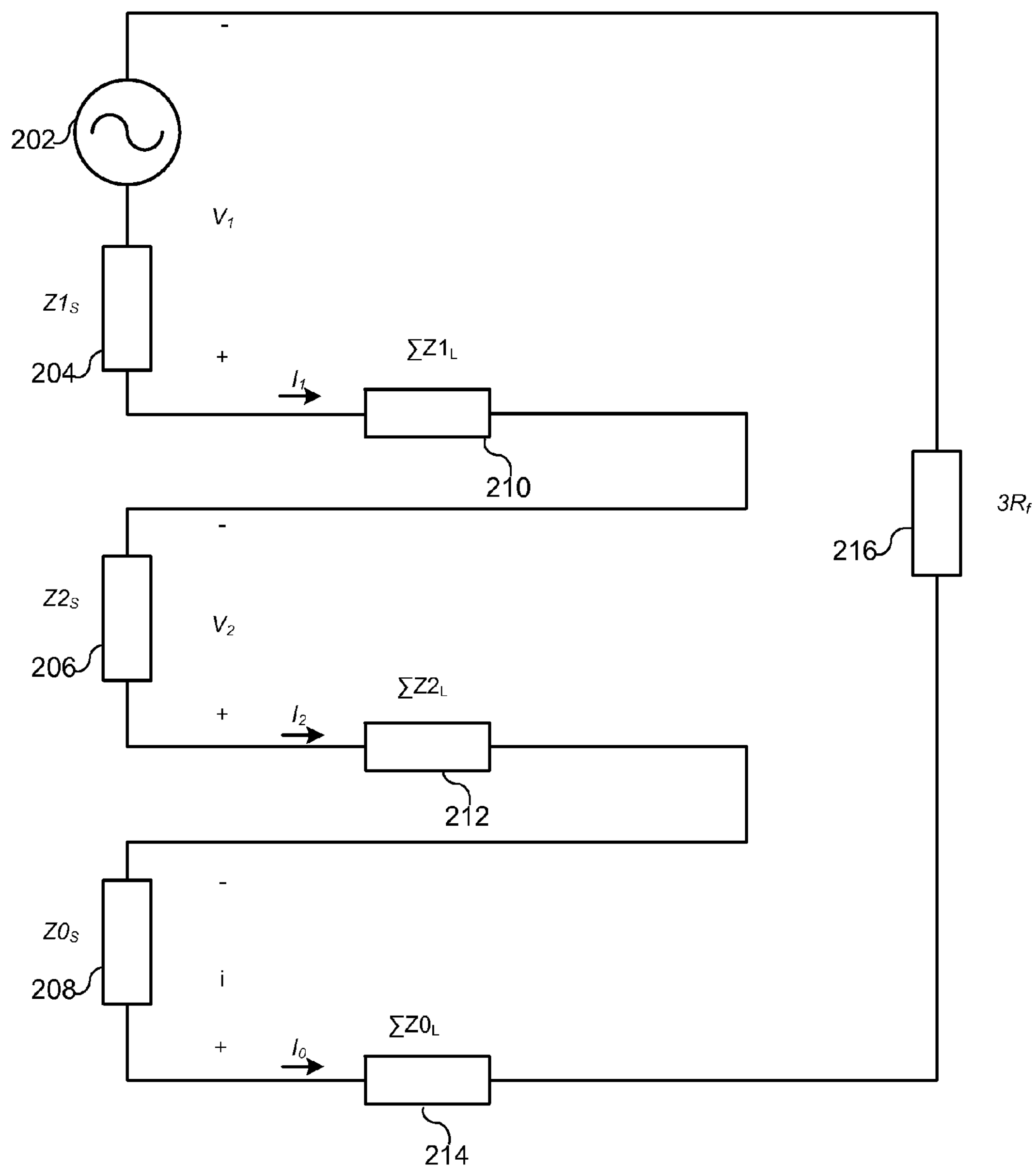
FIG. 2 illustrates a sequence diagram for a single-line to ground fault on an electric power delivery system.

FIG. 2 illustrates a simplified sequence diagram for a single-phase-to-ground fault. The sequence diagram includes a source (illustrated with generator 202), impedances (positive-sequence impedance $Z1_S$ 204, negative-sequence impedance $Z2_5$ 206, and zero-sequence impedance $Z0_S$ 208) in series with total sequence impedances from the substation to the fault ($\Sigma Z1_L$ 210, $\Sigma Z2_L$ 212, $\Sigma Z0_L$ 214). Further, three-times the fault resistance $3R_f$ 216 is in series in this sequence diagram.

For a single-phase-to-ground fault, the total sequence reactance to the fault can be calculated using Equation 2.10:

$$X012_{calc} = \sum_{i=1}^{k} (X1_i + X2_i + X0_i) = \frac{Im(V_{phase} * I_2^*)}{|I_2|^*} \quad \text{Eq. 2.10}$$

where:

$X012_{calc}$ is the calculated sequence reactance to the fault;

k is the number of line segments between the fault location and the fault;

X1 is the positive-sequence reactance with the kth line segment;

X2 is the negative-sequence reactance with the kth line segment;

X0 is the zero-sequence reactance with the kth line segment;

I2 is the negative-sequence current referenced to the faulted phase;

$V_{phase}=V_1+V_2+V_0$, referenced to the faulted phase;

$V_1$ is the positive-sequence voltage, referenced to the faulted phase;

$V_2$ is the negative-sequence voltage, referenced to the faulted phase; and, $V_0$ is the zero-sequence voltage, referenced to the faulted phase.

As used herein, "total sequence" refers to the sum of the positive, zero, and negative sequence. Further, although negative-sequence current $I_2$ is used in Equation 2.10, positive-sequence current $I_1$, zero-sequence current $I_0$, or a combination thereof may be used.

Figure 3:
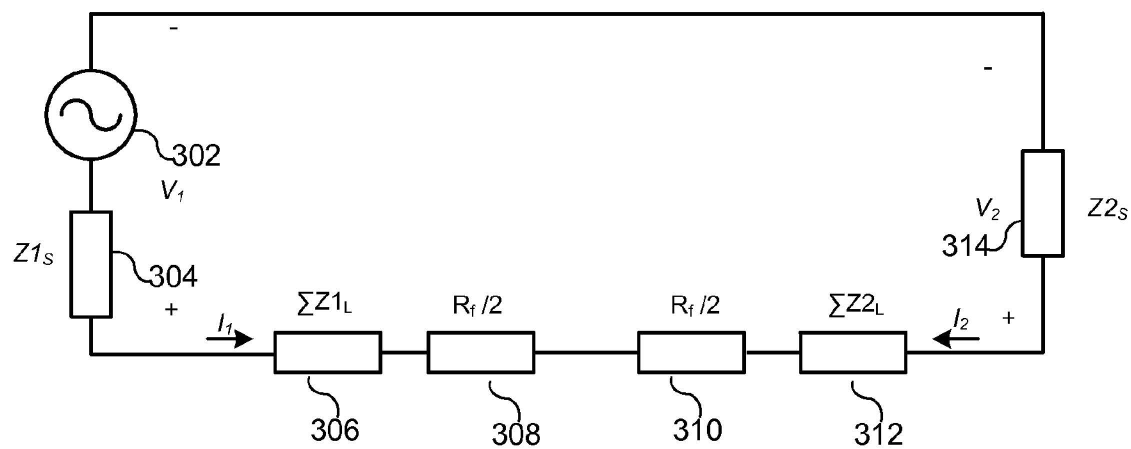
FIG. 3 illustrates a sequence diagram for a phase-to-phase fault on an electric power delivery system.

For a phase-to-phase fault, the sequence diagram is illustrated in FIG. 3. The sequence diagram includes, in series, the source 302, the positive-sequence impedance $Z1_S$ 304, the positive-sequence impedance $\Sigma Z1_L$ 306, half of the fault resistance $$\frac{R_f}{2} 308,$$

half of the fault resistance $$\frac{R_f}{2} 310,$$

the negative sequence impedance $\Sigma Z2_L$ 312, and the negative-sequence impedance $Z2_S$ 314. The reactance between the IED and the fault location is calculated using Equation 2.20:

$$X1_{calc} = \sum_{i=1}^{k} X1_i = Im\left(\frac{V_1 - V_2}{I_1 - I_2}\right) \quad \text{Eq. 2.20}$$

where:

$X1_{calc}$ is the calculated positive-sequence reactance to the fault; and, $V_1$, $V_2$, and $I_1$ are illustrated in FIG. 3, and are referenced to the faulted phase.

In some embodiments, certain measurements may not be available, useable, or preferable. Accordingly, other equations may be used to calculate a reactance between the IED and the fault location. For example, if it is not preferable to use positive-sequence current, $I_1$, then Equation 2.21 may be used to calculate the reactance between the IED and the fault location:

$$X1_{calc} = \sum_{i=1}^{k} X1_i = Im\left(\frac{V_2 - V_1}{2 * I_2}\right) \quad \text{Eq. 2.21}$$

Figure 4:
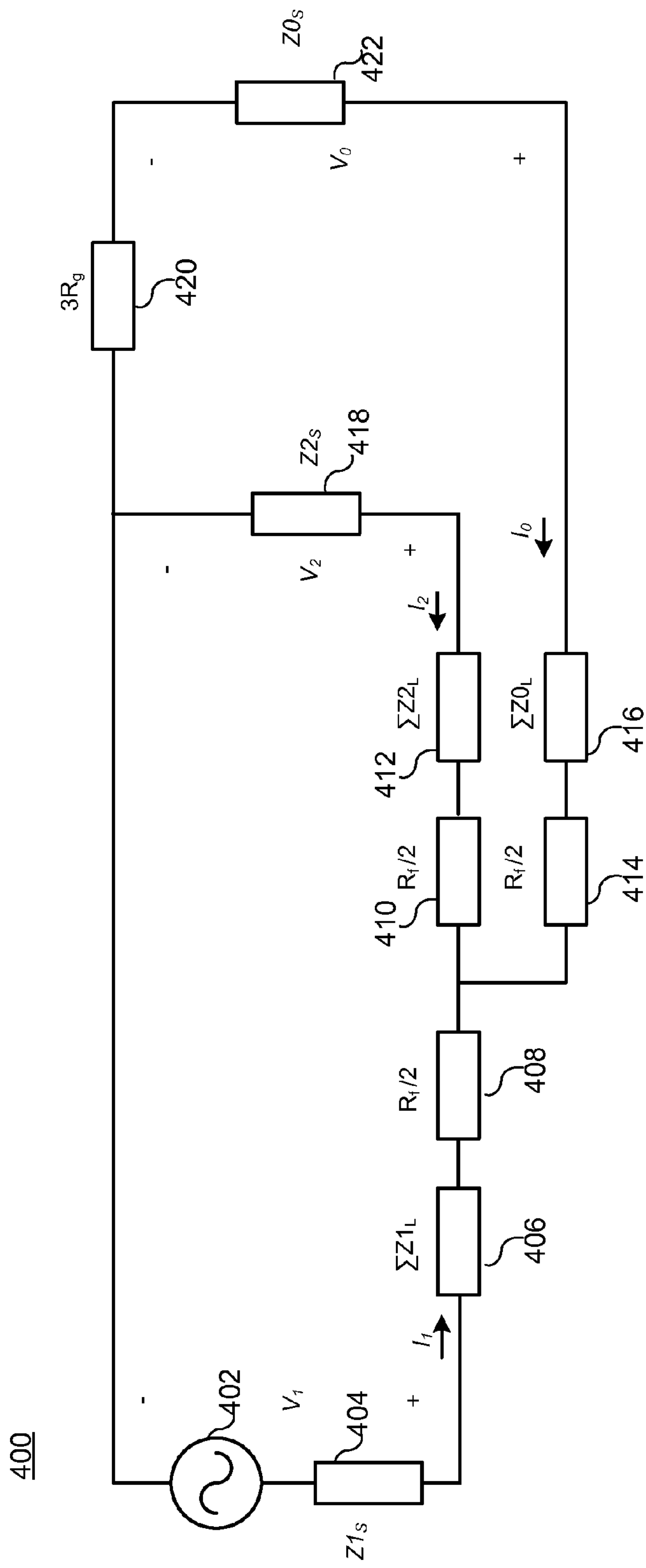
FIG. 4 illustrates a sequence diagram for a phase-to-phase-to-ground fault on an electric power delivery system.

For a phase-to-phase-to-ground fault, the sequence diagram is illustrated in FIG. 4. $R_f$ indicates the fault resistance between phases and $R_g$ indicates the fault resistance to ground. Equations 2.20 and 2.21 can be used to calculate the reactance to the fault for the phase-to-phase-to-ground fault.

Figure 5:
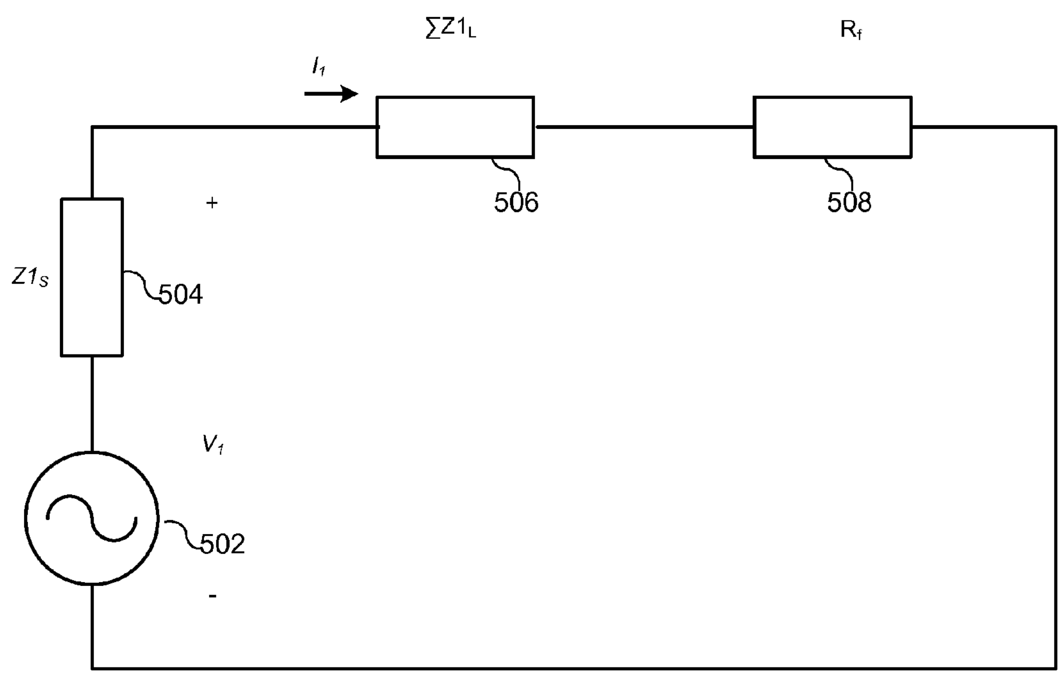
FIG. 5 illustrates a sequence diagram for a three-phase fault on an electric power delivery system.

FIG. 5 illustrates the sequence diagram for a three-phase fault. The total reactance for the three-phase fault may be calculated using Equation 2.30:

$$X1_{calc} = \sum_{i=1}^{k} X1_i = Im\left(\frac{V_1}{I_1}\right) \quad \text{Eq. 2.30}$$

where:

$X1_{calc}$ is the calculated positive-sequence reactance to the fault; and, $V_1$ and $I_1$ are illustrated in FIG. 5, and are referenced to the faulted phase.

Using the above equations, $X_{calc}$ may be determined using only the sensed voltages and currents. Turning again to FIG. 1, once the fault 160 has been detected by IED 110, the IED 110 can determine the location of the fault using the sensed fault voltage and fault current to determine $X_{calc}$. That is, the IED 110 uses the known line parameters to calculate the distance to the fault along the path of the electric power delivery system using the calculated reactance to the fault.

For this calculation, the IED 110 must have the information related to the physical parameters of the power conductor(s) from the IED to the fault. To that end, these parameters may be stored within the IED for retrieval and use during the calculation of the fault location. That is, the IED may have stored the information related to the length, sequence resistances, sequence reactances, and such parameters of lines 132, 138, 140, and 142. With this information, $X_{calc}$ can be compared with accumulated reactances at points along the path to the fault to determine a location of the fault. The location of the fault may be reported as a distance to the fault following the path of the conductor.

Figure 6:
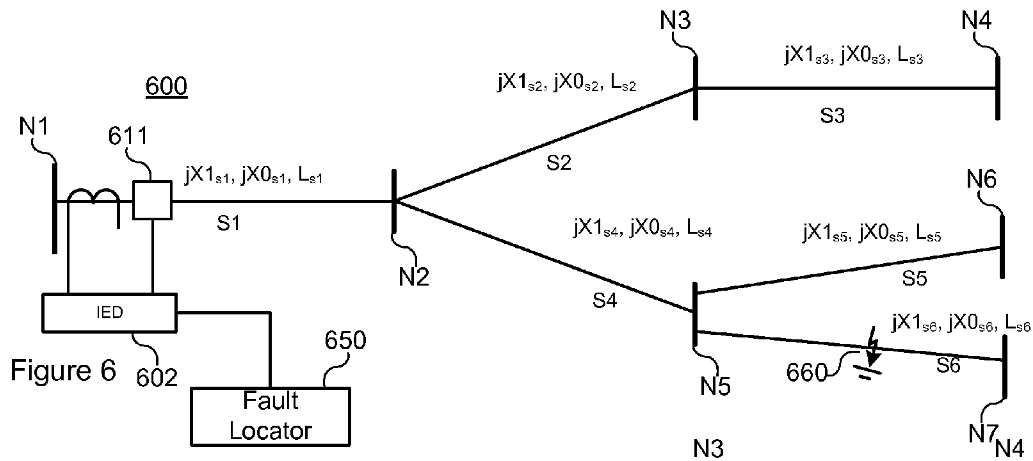
FIG. 6 illustrates a one-line diagram of a branched electric power delivery system.
Figure 7:
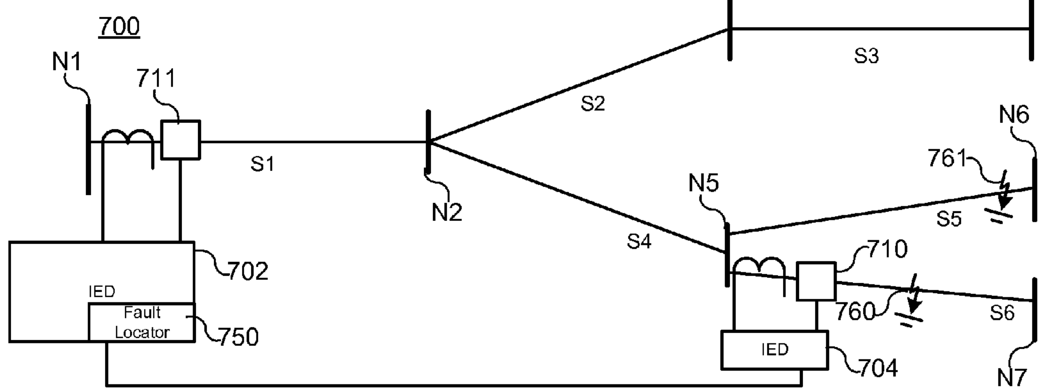
FIG. 7 illustrates a one-line diagram of a branched electric power delivery system.
Figure 8:
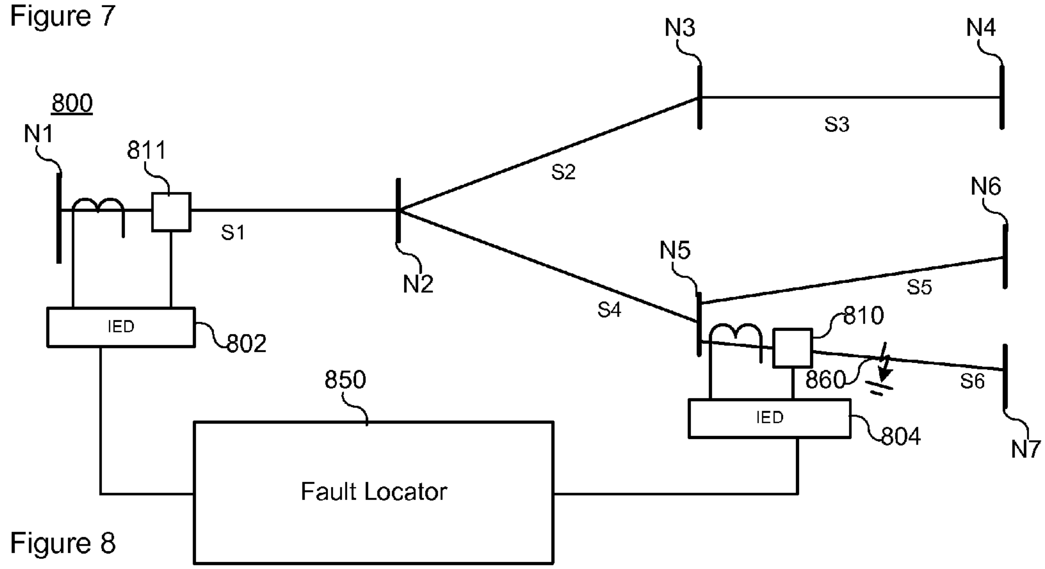
FIG. 8 illustrates a one-line diagram of a branched electric power delivery system.

Certain electric power delivery systems include branches from a primary feeder. Typically a common feeder is monitored and protected by an IED. FIGS. 6-8 illustrate one-line diagrams of electric power delivery systems 600, 700 and 800. FIG. 6 illustrates an electric power delivery system 600 with a common feeder segment S1 monitored by IED 602. Common feeder segment S1 extends from node N1 to node N2, and is connected to two branch segments S2 and S4 extending from node N2 and that operate in parallel to each other. Branch segment S2 extends from node N2 to node N3, where branch segment S3 extends further to node N4. Branch segment S4 extends from node N2 to node N5, and is in connection with two further branch segments S5 and S6, each extending from node N5 and that operate in parallel to each other. Branch segment S5 extends from node N5 to node N6, and branch segment S6 extends from node N5 to node N7.

Although many or all of the segments may include switches, transformers, circuit breakers, and other electric power delivery system equipment, FIG. 6 illustrates a single circuit breaker 611 located on segment S1. The circuit breaker may be opened or closed, and may be monitored and/or controlled by an IED 602.

Each segment of the electric power delivery system 600 may include various parameters, such as the conductor type, phases present in the segment, positive-sequence reactance X1, positive-sequence resistance R1, the zero-sequence reactance X0, zero-sequence resistance R0, the length D, and so forth. Table 1 illustrates the parameters of each segment of the electric power delivery system:

TABLE 1

| Segment | Conductor Type | Phase(s) | Length (ft) | R1 (Ohm) | X1 (Ohm) | R0 (Ohm) | X0 (Ohm) |
|---|---|---|---|---|---|---|---|
| S1 | 750CU | ABC | $D_{S1}$ | $R1_{S1}$ | $X1_{S1}$ | $R0_{S1}$ | $X0_{S1}$ |
| S2 | 336AAC | AB | $D_{S2}$ | $R1_{S2}$ | $X1_{S2}$ | $R0_{S2}$ | $X0_{S2}$ |
| S3 | 336AAC | A | $D_{S3}$ | $R1_{S3}$ | $X1_{S3}$ | $R0_{S3}$ | $X0_{S3}$ |
| S4 | 336AAC | ABC | $D_{S4}$ | $R1_{S4}$ | $X1_{S4}$ | $R0_{S4}$ | $X0_{S4}$ |
| S5 | 750CU | ABC | $D_{S5}$ | $R1_{S5}$ | $X1_{S5}$ | $R0_{S5}$ | $X0_{S5}$ |
| S6 | 750CU | ABC | $D_{S6}$ | $R1_{S6}$ | $X1_{S6}$ | $R0_{S6}$ | $X0_{S6}$ |

The electric power delivery system 600 is monitored and protected by IED 602, which may collect power system information from the conductor at common feeder segment S1 using, for example, current transducers (CTs), potential transducers (PTs), Rogowski coils, and the like, to obtain electric power delivery system voltages and currents therefrom. Using the electric power delivery system information, IED 602 may calculate further power system information, such as sequence voltages, sequence currents, frequencies, phase voltages, phase currents, impedances, sequence impedances, reactances, sequence reactances, and the like. The distance to the fault may be calculated by a fault locator 650 that may be a module operating on IED 602, or on a separate device in communication with IED 602. The fault locator 650 may perform the steps of receiving an indication that a fault condition has been detected, requesting electric power system fault information (such as fault voltages, fault currents, and the like), and performing the calculations to determine possible locations of the fault. The fault locator 650 may perform these tasks automatically upon receiving an indication that the faulted condition has been detected.

As described above, if a fault 660 were to exist on the electric power delivery system, the IED 602 may determine the fault type using the gathered electric power delivery system information. With the electric power delivery information, the IED 602 may then calculate the fault type, and determine $X_{calc}$ 660. For example, if it has been determined that the fault type is A-phase-to-ground, then Equation 2.10 is used to calculate the calculated total sequence reactance to the fault. Further, using $X_{calc}$ and the electric power delivery system information as indicated in Table 1, the IED may determine possible fault locations in terms of the distance to the fault along each of the three possible paths to possible fault locations. That is, path 1 includes segments S1, S2, and S3; path 2 includes segments S1, S4, and S5; and, path 3 includes segments 51, S4, and S6.

FIG. 7 illustrates another configuration of the electric power delivery system 700, where the system is monitored by two IEDs 702 and 704. IED 702 is located on segment S1, and is configured to detect downstream faults on the electric power delivery system 700, and control circuit breaker 711. Accordingly, IED 702 would detect fault 760 on segment S6. The electric power delivery system 700 is further monitored by IED 704 located on segment S6, and which is in communication with recloser 710. IED 704 may be, for example, a recloser control, configured to monitor segment S6 (by obtaining power system conditions therefrom such as voltage, current, frequency, and the like), and operate recloser 710 upon occurrence of certain power system events. For example, IED 704 may be configured to operate recloser 710, if fault 760 is detected.

System 700 may further include a fault locator 750 for determining the location of a fault once the fault has been detected on the electric power delivery system. As illustrated, fault locator 750 is a module resident in IED 702. However, the fault locator 750 may be a module resident in IED 704. Nevertheless, the fault locator 750 may be configured to receive electric power system information upon occurrence of a fault, and use the electric power system information to determine the location of the fault. As illustrated above, fault locator 750 may be configured to calculate $X_{calc}$ using the fault voltages and/or currents detected and available from IEDs 702, 704.

It should be noted that in system 700, both IEDs 702, 704 will detect fault 760, and both will gather the faulted electric power system information because fault 760 is electrically downstream from each IED 702, 704. IED 704 is in communication with IED 702, and the faulted electric power system information collected by IED 704 would be communicated to IED 702. IED 704 may also send a flag indicating that fault 760 has been detected. Fault locator 750 would then have two sources or fault data available to determine the fault location. Fault locator 750 may decide which set of faulted electric power system information to use—that from IED 702 or that from IED 704. Fault locator 750 may be configured to select the best data for fault location. The best data may be that from the IED that is electrically closest to the fault. The best data may be data that is sufficiently accurate for fault location calculations. A preliminary calculation of the distance to the fault using the data from IED 702 and the data from 704 would give an indication of the IED electrically closest to the fault. In this case, IED 704 is electrically closest to fault 760, and the collected power system information from IED 704 would, therefore, most likely be more accurate than the data gathered by the more distant IED 702. Accordingly, the fault locator 750 could choose to perform its fault location calculations using the data from IED 704 rather than the data from IED 702. Thus, the fault locator 750 selects the best data for determining fault location.

FIG. 7 also illustrates another fault 761 on segment S5 of the electric power delivery system 700. In the case of the occurrence of fault 761 instead of fault 760, IED 704 would not detect fault 761, and so, would not send information related thereto or indication thereof to IED 702 (or to the fault locator 750). In this case, the fault locator 750 would use only the electric power delivery system information from IED 702 to calculate the location of fault 761.

Furthermore, although not illustrated, the fault locator 750 may operate as a module on IED 704 instead of on IED 702. In this case, IED 704 and fault locator 750 would not need electric power delivery system information from IED 702 to detect or calculate the location of fault 760. However, because only IED 702 would detect fault 761, a fault locator operating on IED 704 would need electric power delivery system information from IED 702 to calculate the location of fault 761.

FIG. 8 illustrates yet another configuration for monitoring the electric power delivery system 800. According to this configuration, fault locator 850 is a separate device from IED 802 and IED 804. As above, IED 802 may be configured to monitor the entire electric power delivery system from its position on Segment 51 and operate circuit breaker 811. IED 804 may be a recloser control for operating the recloser 810 on segment S6. Both IEDs may be in communication with the fault locator 850, and may communicate detected fault information thereto. As above, once fault 860 occurs on the system, the fault locator 850 receives the electric power system fault data, and selects the best data to use for performing the calculations of the fault location.

When the configuration includes more than one IED, and the fault locator selects the data from a particular IED to use for its fault location algorithms, the fault location may be calculated from the IED where the data is gathered. That is, the calculated distance to the fault will be calculated as a distance from the IED providing the data for the fault location.

Figure 9A:
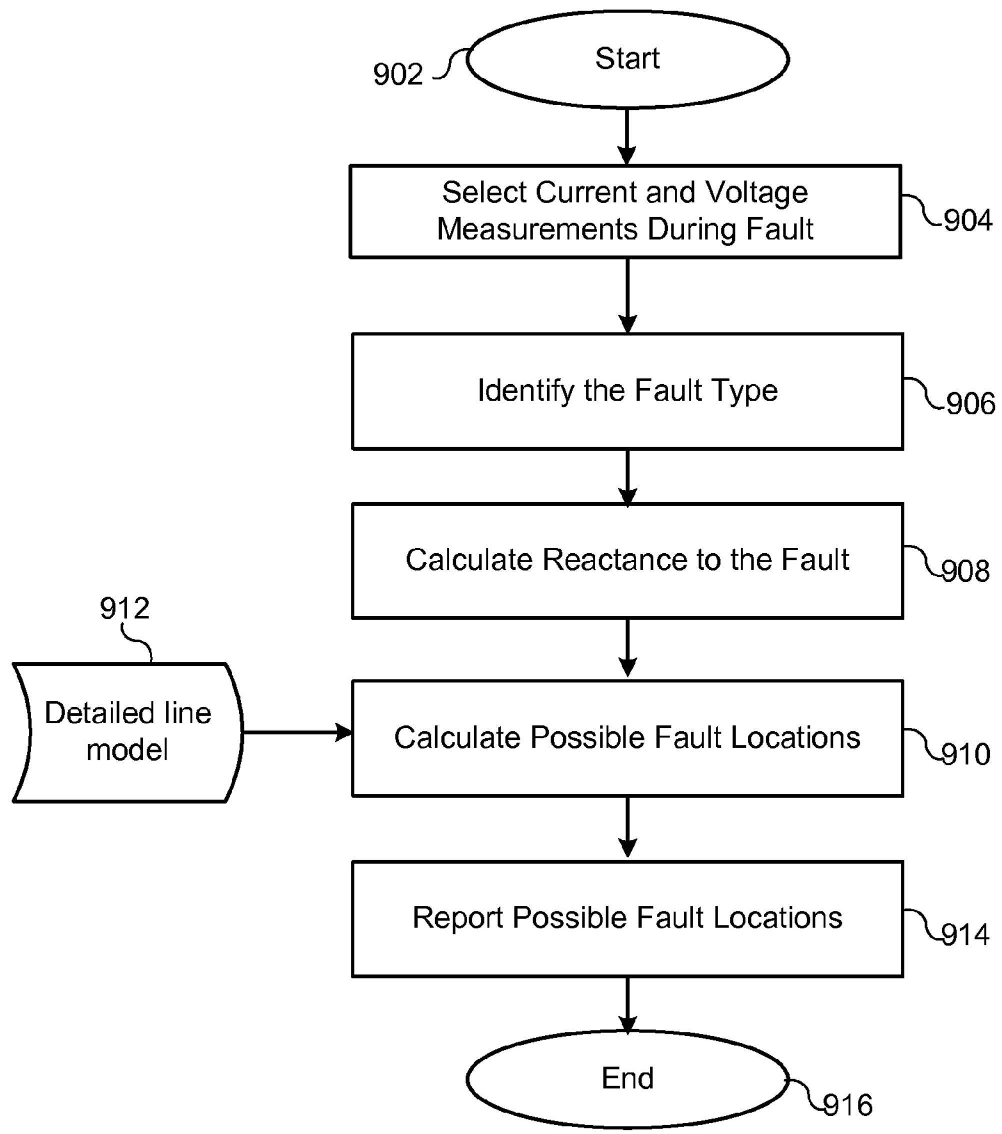
FIGS. 9A-9D illustrate process flow diagrams for calculating possible locations of a fault on an electric power delivery system using an electric power delivery system model and reactance to the fault.

As mentioned above, determination of the location of the fault may be performed using the above equations, or other equations that may be useful for determining the distance to the fault. FIG. 9A illustrates generally a process flow diagram useful for determining the location of the fault 900. The method 900 starts 902 when a fault is detected on the electric power delivery system. The detection of a fault may trigger a fault locator, such as any of those illustrated in FIGS. 6-8, operating in an IED that is in communication with the electric power delivery system, or in an IED that receives information from IEDs in communication with the electric power delivery system. Once a fault is detected by an IED, the IED may send an indication of the faulted condition (by setting a communication bit, setting an alarm contact, sending a message, or the like) to the fault locator that a fault has been detected. The fault locator may then request electric power system fault information from the one or more IED(s) that detected the fault, or the IED(s) could simply send the electric power system fault information to the fault locator upon detection of the fault. In either case, the fault locator automatically acquires the fault information from the IED(s).

If the fault locator receives fault information from more than one IED, the fault locator selects the fault information 904 that is most productive for the fault location method. That is, the information gathered from a location electrically closest to the fault may be most productive. If the information is of a lower quality (gathered by an IED of lower quality) than information from another IED, it may be less productive for use in the fault location algorithms. The fault locator may be programmed during setup as to which IEDs provide high quality information and which IEDs provide lower quality information, and the fault locator may be then biased toward using electric power delivery system information from the IEDs providing higher quality information. As mentioned above, if more than one IED reports the fault, the fault locator can select to use the fault information only from the IED electrically closest to the fault. With the selected fault information (such as voltages and currents), the method next identifies the fault type (phase-to-ground, phase-to-phase-to-ground, phase-to-phase, three-phase, three-phase-to-ground, or the like, along with which phase(s) is/are involved in the fault) 906. Once the fault type has been determined, the method calculates the reactance to the fault 908 ($X_{calc}$) using, for example, the equations described above. Once $X_{calc}$ to the fault is determined 908, the method uses $X_{calc}$ to the fault to determine the possible locations of the fault on the electric power delivery system 910.

The method receives detailed line model information 912 concerning the electric power delivery system. The detailed line model information 912 may include the physical parameters and/or configuration of the electric power delivery system. For example, the information may include the topology of the system in terms of nodes, segments, circuit breaker configuration (open or closed), switch configuration (open or closed), phases present on each segment, IEDs present on each segment, conductor types for each segment, conductor lengths for each segment, reactances (sequence or phase) for each segment, resistances (sequence or phase) for each segment, conductor types for each segment, faulted circuit indicators (FCIs) present on each segment and their position on the segment (e.g. in terms of length along the conductor from the "from" node to the FCI), and the like. The method may use this detailed line model information to determine the possible fault locations. For example, the method may use the detailed line model 912 to determine which of the calculated possible fault locations includes the faulted phase(s) and which do not. Those that do not include the faulted phase(s) are removed from the list of possible fault locations. Further, the method may remove possible fault locations based on the impedance criteria of the segments as indicated in the detailed line model. Once the possible fault locations have been determined 910, the method reports the possible fault locations 914. The reporting may be performed as an output to a human-machine interface (HMI), a report sent via electronic means, a report stored for retrieval, or the like. Once the possible fault locations have been reported 914, the method ends 916.

As mentioned above, when data from more than one IED are available, and the method selects the data from one of the IEDs, $X_{calc}$ is calculated as the calculated reactance to the fault from the location of the IED that reports the fault data that is used by the fault locator to determine the fault location.

Various methods may be used to calculate the possible fault locations using the calculated reactance to the fault, some of which are described below.

One method for determining the possible fault locations is to calculate an accumulated reactance and accumulated distance for the line segments and to compare the accumulated reactance against $X_{calc}$. As with several of the methods described below, this method may use a lookup table populated with accumulated reactances and distances that can be used to compare with $X_{calc}$, or the reactances and distances can be summed by following the various paths to possible fault locations.

With the available line segment information as indicated in Table 1, the fault locator can calculate the accumulated reactance and the accumulated distance of each line segment. The accumulated line reactance of a line segment is defined as the summation of the line reactance of this line segment together with the line reactance of all other segments that connect this line segment to the measurement point. Each line segment may have two accumulated line reactance values, namely, $\mathbf{X012}_{acc}$ and $\mathbf{X1}_{acc}$. Given the electric power system illustrated in FIG. 6, the accumulated line reactance values for each line segment are defined in Table 2. In FIG. 6, $X1_k$, $X0_k$, and $D_k$ are the respective positive-sequence reactance, zero-sequence reactance, and length for segment k.

TABLE 2

| Line Segment | Accumulated X1 ($X1_{acc}$) | Accumulated X012 ($X012_{acc}$) | Accumulated Distance ($D_{acc}$) |
|---|---|---|---|
| S1 | $X1_1$ | $2 * X1_1 + X0_1$ | $D_1$ |
| S2 | $X1_1 + X1_2$ | $2 * (X1_1 + X1_2) + (X0_1 + X0_2)$ | $D_1 + D_2$ |
| S3 | $X1_1 + X1_2 + X1_3$ | $2 * (X1_1 + X1_2 + X1_3) + (X0_1 + X0_2 + X0_3)$ | $D_1 + D_2 + D_3$ |
| S4 | $X1_1 + X1_4$ | $2 * (X1_1 + X1_4) + (X0_1 + X0_4)$ | $D_1 + D_4$ |
| S5 | $X1_1 + X1_4 + X1_5$ | $2 * (X1_1 + X1_4 + X1_5) + (X0_1 + X0_4 + X0_5)$ | $D_1 + D_4 + D_5$ |
| S6 | $X1_1 + X1_4 + X1_6$ | $2 * (X1_1 + X1_4 + X1_6) + (X0_1 + X0_4 + X0_6)$ | $D_1 + D_4 + D_6$ |

For single-phase-to-ground faults, the total sequence reactance may be calculated according to Equation 2.10, above, and used for fault location in conjunction with Table 2. For other fault types, the positive-sequence reactance X1 may be calculated according to the above equations. However, other equations and techniques may be used to calculate reactance to the fault for use in conjunction with Table 2. For example, other equations may be used to calculate a positive-sequence reactance to the fault for single-phase-to-ground faults, and used in conjunction with Table 2 to locate the possible fault locations.

As mentioned above, the accumulated line reactance values and total distance of each line segment can be pre-calculated and stored in a lookup table such as Table 2 if the feeder topology does not change during power system operation. Alternatively, the values can be stored in a table such as Table 2, and the table can be updated upon topology-changing events such as switching or opening/closing of a circuit breaker or the like. Otherwise, the values such as those in Table 2 can be calculated using the latest topology data in real-time to determine the possible fault locations.

Figure 9B:
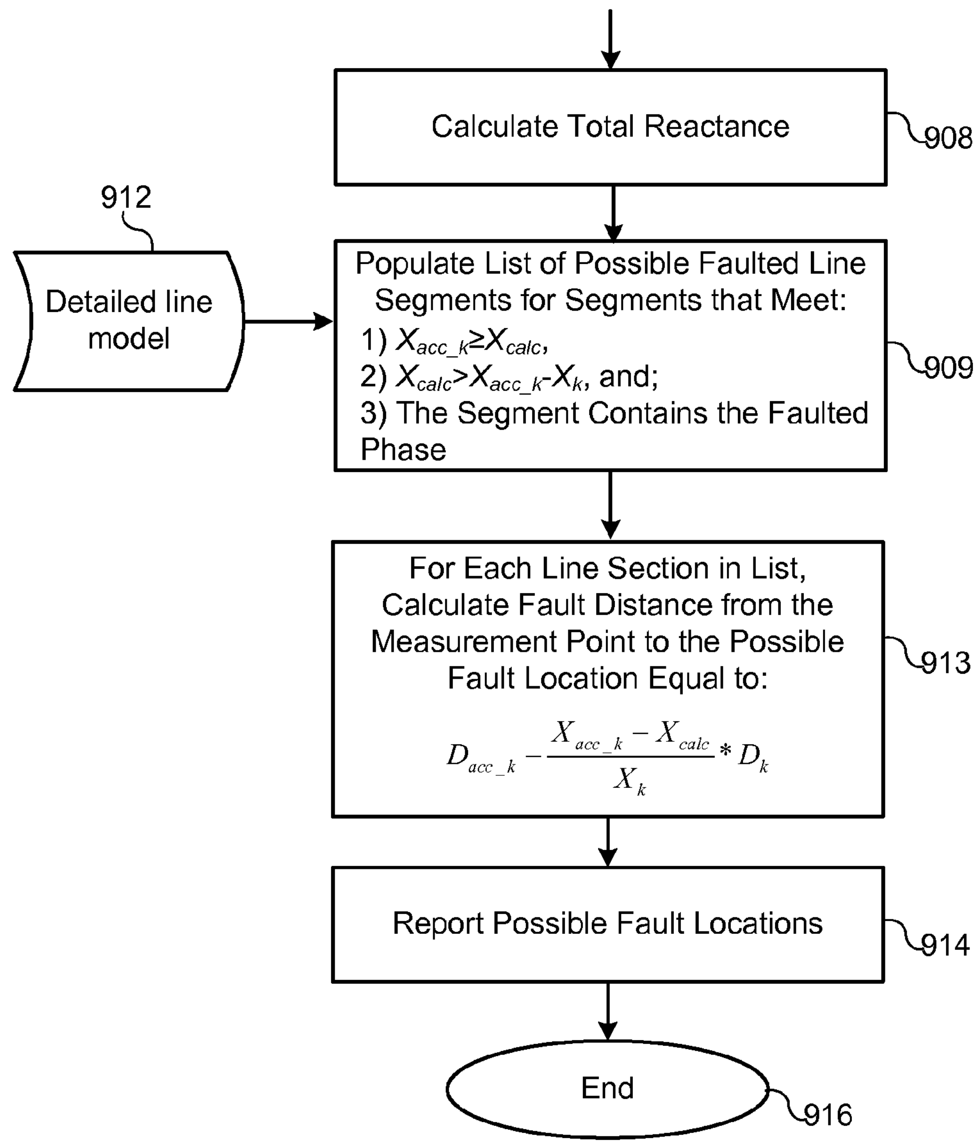

FIG. 9B process flow chart for determining the possible fault locations using the lookup table such as one illustrated in Table 2. The method continues from calculating $X_{calc}$ 908 as described in the method of FIG. 9A. The method then proceeds to populate a list 909 of possible fault locations based on the accumulated reactance $X_{acc\_k}$ in the segments of the electric power system (where subscript k denotes the particular segment number). The list is populated 909 with segments that meet all of: 1) the accumulated reactance for the segment $X_{acc\_k}$ is greater than or equal to $X_{calc}$; 2) $X_{calc}$ is greater than the accumulated reactance for the segment $Y_{acc\_k}$ minus the segment reactance $X_k$; and, 3) the segment includes the faulted phase as determined during fault identification.

The method may then determine the length to the possible fault location along each of the remaining segments 913 in the populated list by finding the difference between the accumulated line distance $D_{acc\_k}$ to the end of the possibly faulted segment and the product of the line segment length $D_k$ and the ratio of the difference between the accumulated reactance to the end of the segment $Y_{acc\_k}$ and $X_{calc}$ to the reactance of the segment $X_k$ as indicated in Equation 3.10:

$$\text{Fault } Location_k = D_{acc\_k} - \frac{x_{acc\_k} - x_{calc}}{x_k} * D_k \quad \text{Eq. 3.10}$$

The method may then report the possible fault locations 914 and end 916.

One method of determining the possible fault locations is to use a lookup table populated with reactance values for various points along the conductive paths of the electric power delivery system. The table may include points that are relatively close such that a comparison of $X_{calc}$ with the reactances in the table would yield satisfactory estimates of the possible fault location. For example, the reactances could be calculated and stored in the table for every 10 feet along each possible path. Alternatively, the table could include a list of possible reactances and corresponding locations on the electric power delivery system. The IED would compare $X_{calc}$ against the reactances in the table to find the segments and locations that are associated with the reactance in the table. Table 3 is one example of a possible lookup table for one of the electric power delivery systems of FIGS. 6-8.

TABLE 3

| | Possible Location A | | | Possible Location B | | | Possible Location C | | | . . . |
|---|---|---|---|---|---|---|---|---|---|---|
| Reactance X (Ohm) | Seg. | Distance Along Segment (ft) | Phase(s) | Seg. | Distance Along Segment (ft) | Phase(s) | Seg. | Distance Along Segment (ft) | Phase(s) | . . . |
| . | . | . | | . | . | | . | . | | . . . |
| . | . | . | | . | . | | . | . | | |
| . | . | . | | . | . | | . | . | | |
| 0.4000 | S2 | 3080.6 | AB | S4 | 3239.1 | ABC | | | | . . . |
| 0.4500 | S3 | 3.4 | A | S4 | 3693.5 | ABC | | | | . . . |
| 0.5000 | S3 | 404.1 | A | S5 | 387.2 | ABC | S6 | 448.1 | ABC | . . . |
| 0.5500 | S3 | 804.8 | A | S5 | 813.3 | ABC | S6 | 941.3 | ABC | . . . |
| 0.6000 | S3 | 1205.4 | A | S5 | 1239.4 | ABC | S6 | 1434.5 | ABC | . . . |
| 0.6500 | S3 | 1606.1 | A | S5 | 1665.5 | ABC | S6 | 1927.7 | ABC | . . . |
| 0.7000 | S3 | 2006.7 | A | S5 | 2091.6 | ABC | S6 | 2420.9 | ABC | . . . |
| . | . | . | | . | . | | . | . | | . . . |
| . | . | . | | . | . | | . | . | | |
| . | . | . | | . | . | | . | . | | |

Figure 9C:
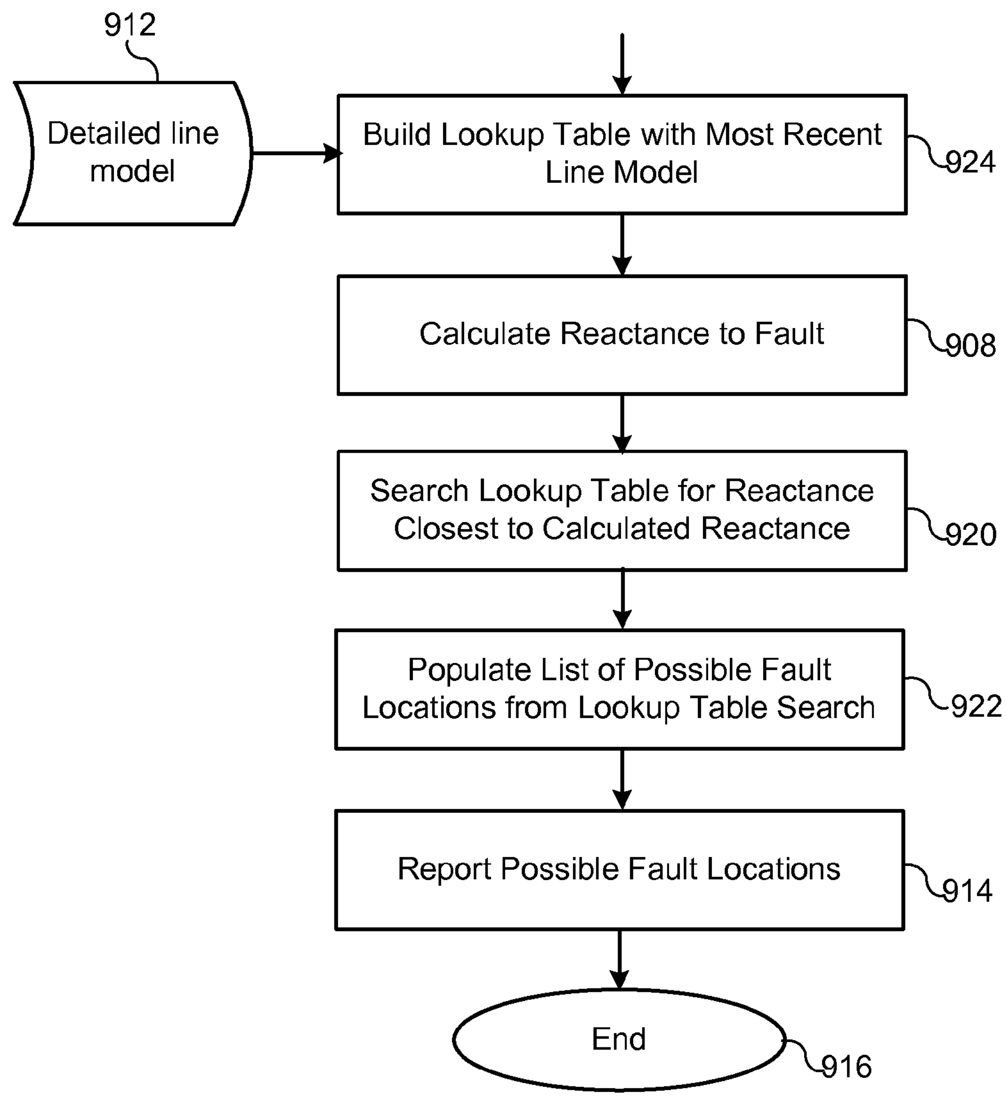

FIG. 9C illustrates a process flow chart for determining the possible fault locations using the lookup table such as one illustrated in Table 3. This method follows from method 900, with further detail of the step of calculating possible fault locations 910. Before the reactance is calculated 908 using the values available to the IED, a lookup table is built 924 using the most recent available detailed line model 912. The most recent line module, as described herein, includes topology information of the electric power delivery system, physical parameters of the segments of the electric power delivery system, and so forth. Accordingly, the lookup table will not include segments that have been switched out before the most recent detailed line model is created, and includes the phases present on each of the segments listed therein, as well as updated distances and reactances for each segment depending on the topology of the system before the most recent detailed line model was created. The lookup table is searched 920 for a reactance with a value closest to $X_{calc}$. A list of possible fault locations is then populated with the possible fault locations found using the lookup table 922 that have reactance values closest to $X_{calc}$ and include the faulted phase. This list of possible fault locations may be reported 914.

The detailed line model 912 includes information about the electric power delivery system that may be used to better evaluate which of the possible fault locations may actually be faulted. To that end, the detailed line model 912 may include physical electric power delivery system information such as the phases present on each segment, the state (open or closed) of circuit breakers on each segment, the state of switches (open or closed) on each segment, and the like. In determining the fault type, the IED determines which is/are the faulted phase(s). If the determined faulted phase(s) is/are not present in one of the possible fault location segments from the lookup table, the IED does not include that possible fault location in the populated list 922. Further, if a circuit breaker or switch to a reported possible fault location was open before the fault occurred, the IED may remove or not include that possible fault location from the table. Accordingly, the table does not include those possible fault locations where the faulted phase(s) is/are not present, or segments that are not receiving power in the path expected by the lookup table due to an open switch or circuit breaker. Once the possible fault locations on the list are reported 914, the method ends 916.

In one example, the electric power delivery system 600 may include a configuration of that of FIG. 6. The fault 660 may exist at about 2150 feet along segment S6 on phase C. The IED 602 would sense the fault, determine the fault type, and calculate $X_{calc}$ from the IED as 0.6677 Ohm. Using Table 3 as the lookup table, the IED would compile a list of possible fault locations that includes 1665.5 feet along segment S5, and 1927.7 feet along segment S6. Because the fault identification indicated that the fault was on phase C and segment S3 does not include phase C (as indicated in Table 4), the location of 1606.1 feet along segment S3 is not included in the list. Further, the detailed line model indicates that all switches leading to segment S6 along the path of segment S1 to segment S4 to segment S6 are closed, so the location on segment S6 remains a possibility. The IED then reports the two possible fault locations as 1665.5 feet along segment S5, and 1927.7 feet along segment S6. The actual location of the fault is 2101.5 feet along segment S6.

In another method, fault locator 650 may include in memory (or receive from IEDs 602, 604, or compile using data received from IEDs 602, 604) a table of the reactance at various points or nodes (e.g. from the IED 602 to the node) along various paths in the electric power delivery system. The table could further include physical parameters for each segment useful for determining a sum of the reactance on the segment from one of its nodes. Alternatively, a separate table indicating this information (such as Table 1, above) may be used in conjunction therewith. Table 4 is an example of one such table that includes the positive-sequence reactance at each node (indicated as "From" and "To" nodes for each segment, the lengths to the "To" nodes on each segment, and positive-sequence and zero-sequence reactances for each segment.

TABLE 4

| Segment | From Node | Reactance $X_{1\_From}$ (Ohm) to From Node | To Node | Reactance $X_{1\_TO}$ (Ohm) to To Node | Length to To Node $D_{acc}$ (ft) | Segment Positive-Sequence Reactance $X_1$ (Ohm) | Segment Zero-Sequence Reactance $X_0$ (Ohm) | Phase(s) |
|---|---|---|---|---|---|---|---|---|
| S1 | N1 | 0 | N2 | 0.0436 | 1077 | 0.04357 | 0.204 | ABC |
| S2 | N2 | 0.0436 | N3 | 0.4496 | 3509 | 0.406 | 1.5072 | AB |
| S3 | N3 | 0.4496 | N4 | 1.2675 | 6554 | 0.8179 | 2.8827 | A |
| S4 | N2 | 0.0436 | N5 | 0.4546 | 3735 | 0.411 | 1.521 | ABC |
| S5 | N5 | 0.4546 | N6 | 0.8566 | 3426 | 0.402 | 1.4928 | ABC |
| S6 | N5 | 0.4546 | N7 | 0.8807 | 4203 | 0.4261 | 1.5389 | ABC |

Figure 9D:
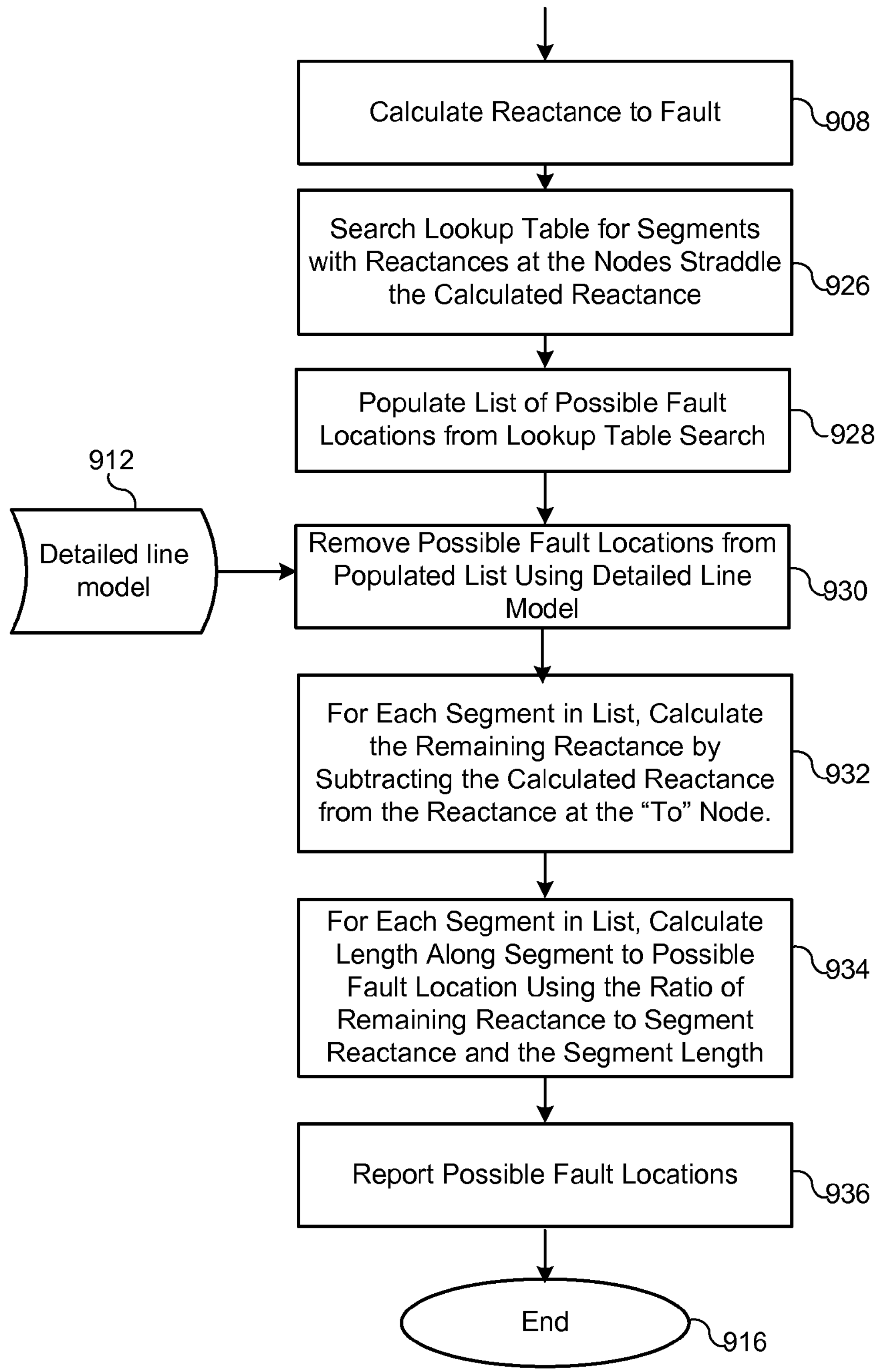

A comparison of $Y_{calc}$ against the reactances in the table would yield the possible faulted segment(s) and possibly an estimate of the location on the faulted segment(s) of the fault. That is, following the method illustrated in FIG. 9D, after the fault locator calculates the reactance to the fault 908, it would search the lookup table to determine which segments had nodes with reactance values that straddle $X_{calc}$ 926 (the reactance of the "From" node is less than $X_{calc}$, and the reactance of the "To" node is greater than $X_{calc}$). These segments would populate the list of possible fault locations 928. The fault locator may receive the detailed line model 912 and remove possible faulted segments from the populated list using the detailed line model 930. Alternatively, the table may be built with the most recent detailed line model 912 and include an indication of the phases present on each segment, as illustrated in Table 4. The list may then be populated only with faulted segments that include the faulted phase.

To further determine the possible fault location, the fault locator would then calculate the distance along each segment remaining in the list to the possible fault locations using a linear relationship of the reactances and segment length. To this end, the fault locator determines the remaining reactance $X_{remain}$ by subtracting $X_{calc}$ from the reactance at the "To" node $X_{k\_To}$ of each segment in the populated list 932. Using the remaining reactance $X_{remain}$, the reactance of the segment $X_k$, and the length of the segment $D_k$, the fault locator calculates the distance along the segment of the possible fault location 934. This may be done by multiplying the ratio of the remaining reactance $X_{remain}$ to the segment reactance $X_k$ by the segment length $D_k$, and subtracting this quantity from the segment length $D_k$. That is, $$D_k - \frac{X_{remain}}{X_k} * D_k.$$

These possible fault locations are then reported 936 and the process ends 916.

Another similar method may be used without a lookup table for determining the length along the electric power delivery system to the fault as well as the length along each possibly faulted segment to the possible fault location by following each possible path along the system. This method simply sums up the reactances along each path, and compares the sums against $X_{calc}$. The distance to the fault on a possibly faulted segment can be calculated as above using a linear relationship between a ratio of reactances and lengths of the segment and as accumulated.

As mentioned above, electric power delivery systems may include a number of electric power line sensors such as FCIs that are configured to collect information from the power line, make certain calculations thereon to make determinations as to the state of the power system, and may further be configured to display certain power system events or conditions, and/or report power system evens or conditions to a central unit. For example, FCIs may be installed on a distribution system to make visual indications of permanent and/or temporary faults on the distribution system. Further, FCIs may be configured with radio communications to send messages concerning power system events and conditions to an IED monitoring the segment of the distribution system on which the FCI is installed. US Patent Application Publication No. 2010/0013632 (with Ser. No. 12/175,584) entitled "Transceiver Interface for Power System Monitoring" describes a system where FCIs capable of radio communication are used to communicate fault location and is herein incorporated by reference in its entirety.

An IED monitoring such an electric power distribution system may receive power system information from the various FCIs. The power system information may include, for example, FCI identification, sensed voltage, sensed current, permanent fault flag, temporary fault flag, time of event, and the like. Such information can be quite helpful in calculating the location of the fault and determining the proper location of the fault on the electric power delivery system.

Figure 10:
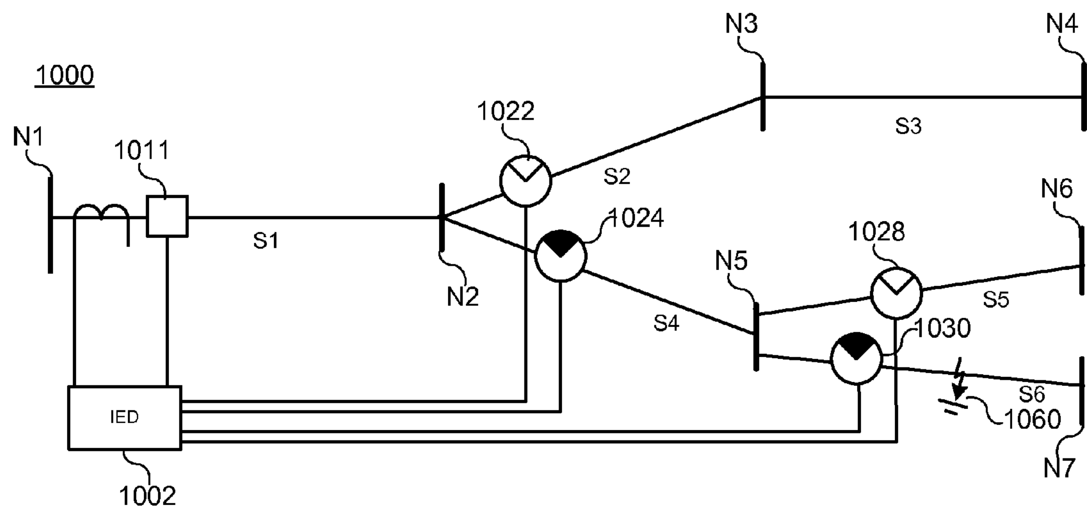
FIG. 10 illustrates a one-line diagram of a branched electric power delivery system.

FIG. 10 illustrates a one-line diagram of an electric power delivery system 1000 with various segments and nodes (similar to those in FIGS. 6-8). The electric power delivery system 1000 is monitored by an IED 1002 in communication with segment 51, as well as by various FCIs 1022, 1024, 1028, and 1030 associated with each of the various segments of the electric power delivery system. It should be noted that an FCI does not need to be installed on a particular segment to be "associated" therewith, as a properly functioning FCI will detect and report faults electrically downstream from itself. For example, although segment S3 has no FCIs installed thereon, segment S3 does have an FCI associated therewith, namely 1022. IED 1002 may be in communication with and operate circuit breaker 1011. More or fewer FCIs may be used to monitor the various line segments of the system. The segments may include circuit breakers and/or switches for opening, closing, or switching the segment in or out of service.

Each FCI is in communication with the IED 1002. The communications between FCIs 1022-1030 and IED 1002 may use any of the various available communication technologies such as contacts, conductors, fiber-optic cables, radio-frequency communication, or the like. As described in the US Patent Application Publication No. 2010/0013632 referenced above, in one example, FCIs 1022-1030 may all communicate with IED 1002 using radio communications.

FCIs 1022-1030 may be configured to monitor the conductors with which they are associated for various conditions, including faulted conditions. FCIs 1022-1030 may be configured to monitor for an overcurrent condition on the associated conductor and indicate when such a fault condition is present on the conductor. FCIs 1022-1030 may be further configured to determine whether the fault is permanent or temporary. FCIs 1022-1030 are configured to report to the IED when a fault is detected, and may display a faulted condition on the FCI itself. FIG. 10 indicates that FCIs 1024, and 1030 have each detected fault 1060, and have indicated the detection of fault 1060. The fault condition detected by FCIs 1024 and 1030 is reported to IED 1002. FCIs 1022 and 1028 have correctly neither detected nor indicated fault 1060, and accordingly, do not report that any fault has been detected.

IED 1002 detects fault 1060, and initiates its fault location algorithm to calculate the location of the fault. As indicated above in conjunction with FIG. 6, IED 1002 may include a fault location module for calculating possible fault locations or the fault location module may be included in a separate device in communication with IED 1002. The fault location algorithm may follow the general steps as indicated above, but further include the step of removing segments from the possible faulted location list using data gathered from the FCIs.

Figure 11:
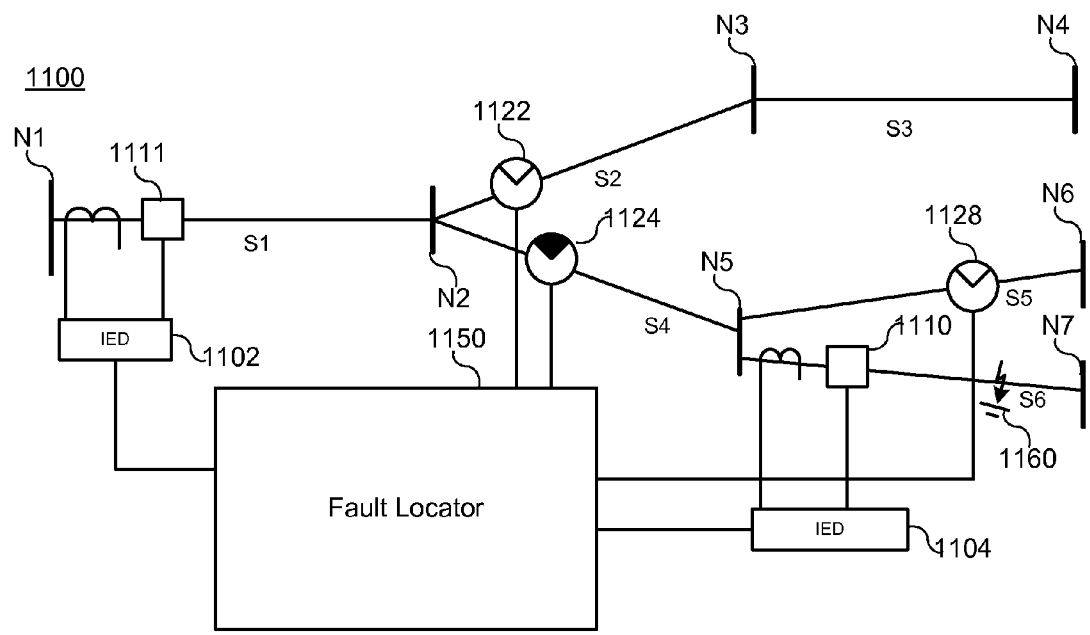
FIG. 11 illustrates a one-line diagram of a branched electric power delivery system.

As described above, the fault locator may function as a module within IED 1002, or in a stand-alone device, or in another IED on the electric power delivery system. FIG. 11 illustrates another configuration for monitoring electric power delivery system 1100 using IED 1102, IED 1104 (which may be a recloser control) in communication with recloser 1110, fault locator 1150, and various FCIs 1122, 1124, and 1128. FCI 1124 correctly detects fault 1160 and report it to fault locator 1150, as do IEDs 1102 and 1104. FCIs 1122 and 1128 correctly neither detect nor indicate detection of fault 1160. IED 1102 may be in communication with and operate circuit breaker 1111. As above, communications may be by any means available such as conductor, fiber-optic, radio frequency, or the like. Further as described above, the fault locator may select the fault data from the best source (electrically closest to the fault and/or best quality data) for performing the fault location calculations.

The fault locator may use information from the FCIs to provide more accurate possible locations for the fault. Generally, if an FCI does not indicate a faulted condition, then the fault locator removes from (or does not include in) a list of possible fault locations all segments associated with that FCI. Accordingly, in FIG. 10, because FCI 1022 does not indicate a faulted condition, segments S2 and S3 will not be included in the list of possible fault locations. Further, the fault locator may determine if an FCI does indicate a fault condition, then all segments that are not associated with that FCI are either removed from or not included in the list of possible fault locations. Turning again to FIG. 10, because FCIs 1030 and 1024 indicated a fault condition, segments not associated with an indicating FCI (segments S2, S3, and S5) will not be included in the list of possible fault locations. Further still, the fault locator may retain only segments associated with an FCI that indicates a fault condition that is also electrically furthest downstream in the electric power delivery system. Again turning to FIG. 10, segment S6 would be kept in the list of possible fault locations because the associated FCI 1030 is electrically further downstream than FCI 1024. With these three criteria, the fault locator includes only segment S6 in the list of possible fault locations. Further refinements as to the location of the fault on segment S6 may be made using the methods described herein.

In order to use the fault detection information available from FCIs, the particular locations of the FCIs may be available to the fault locator. The detailed line module indicates which line segments include associated FCIs, and may include their relative positions on the segments and/or other identifying information concerning the FCIs such as serial number or the like. Accordingly, each FCI may be configured to report its identification or location information to the fault locator. Such location or identification information may be in the form of a serial number, a segment number, position coordinates (such as from a global positioning system (GPS) or the like that may be programmed into the FCI upon installation), or such.

Figure 12A:
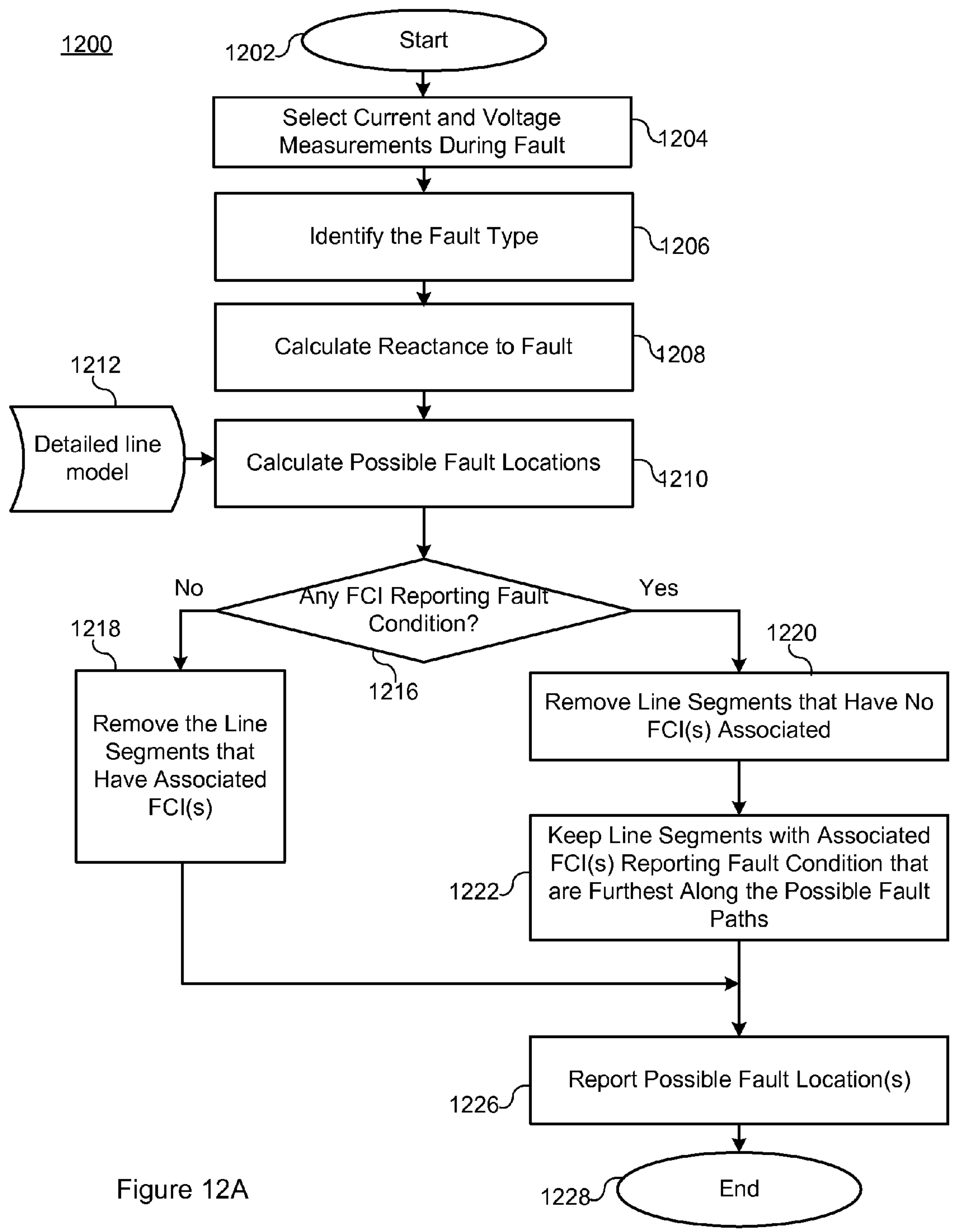
FIG. 12A illustrates a process flow diagram of a method for calculating a location of a fault on an electric power delivery system using an electric power delivery system model, reactance to the fault, and FCI data.

FIG. 12A illustrates a process flow diagram 1200 of a method for calculating the location of the fault using both data from an IED as well as information available from FCIs. The method 1200 starts 1202 when a fault is detected. The fault locator may function as is described above to receive indication of the detection of the fault and to receive the fault data from the IED(s). Fault detection information from the FCIs may also be communicated to the fault locator. The fault locator then selects current and voltage measurements during the fault to use in its fault location calculations 1204. As above, fault data may be available from multiple IEDs, and the fault locator may select the best fault data. Once the appropriate fault data is selected, the fault locator identifies the fault type 1206. With the fault data and the fault type indication, the method calculates the reactance to the fault 1208, also as described above. The method then calculates the possible fault locations 1210. The step of calculating the possible fault locations 1210 may follow any of the methods as described above in conjunction with FIG. 9B, 9C, or 9D to create a list of possible fault locations. The step may include use of the detailed line model 1212, as described above, to narrow down the list of possible fault locations based on the phases involved in the fault and the phases present at each of the calculated possible fault locations, and on line impedance criteria.

The method 1200 also uses FCI reports to more accurately create a list of possible fault locations. The method asks whether any FCIs report the fault 1216. If no FCIs report the fault, then all of the line segments that have an associated FCI are removed from the list of possible fault locations 1218, and the method reports the remaining list of possible fault locations 1226 as described above, and ends 1228. If, however, there are FCIs that are reporting the fault condition, the method removes from the list all line segments that have no FCI(s) associated therewith 1220. The method keeps the line segments with the FCI(s) that report the fault condition that are also the FCI(s) that are furthest from along the path to the possible fault location 1222. That is, turning to FIG. 10, only segment S6 would remain in the list because that is the segment with an FCI 1030 that is furthest along the path to the possible fault location that is indicating a faulted condition. With the list thus created and refined, the method finally reports the list of possible fault locations 1226 and ends 1228.

Figure 12B:
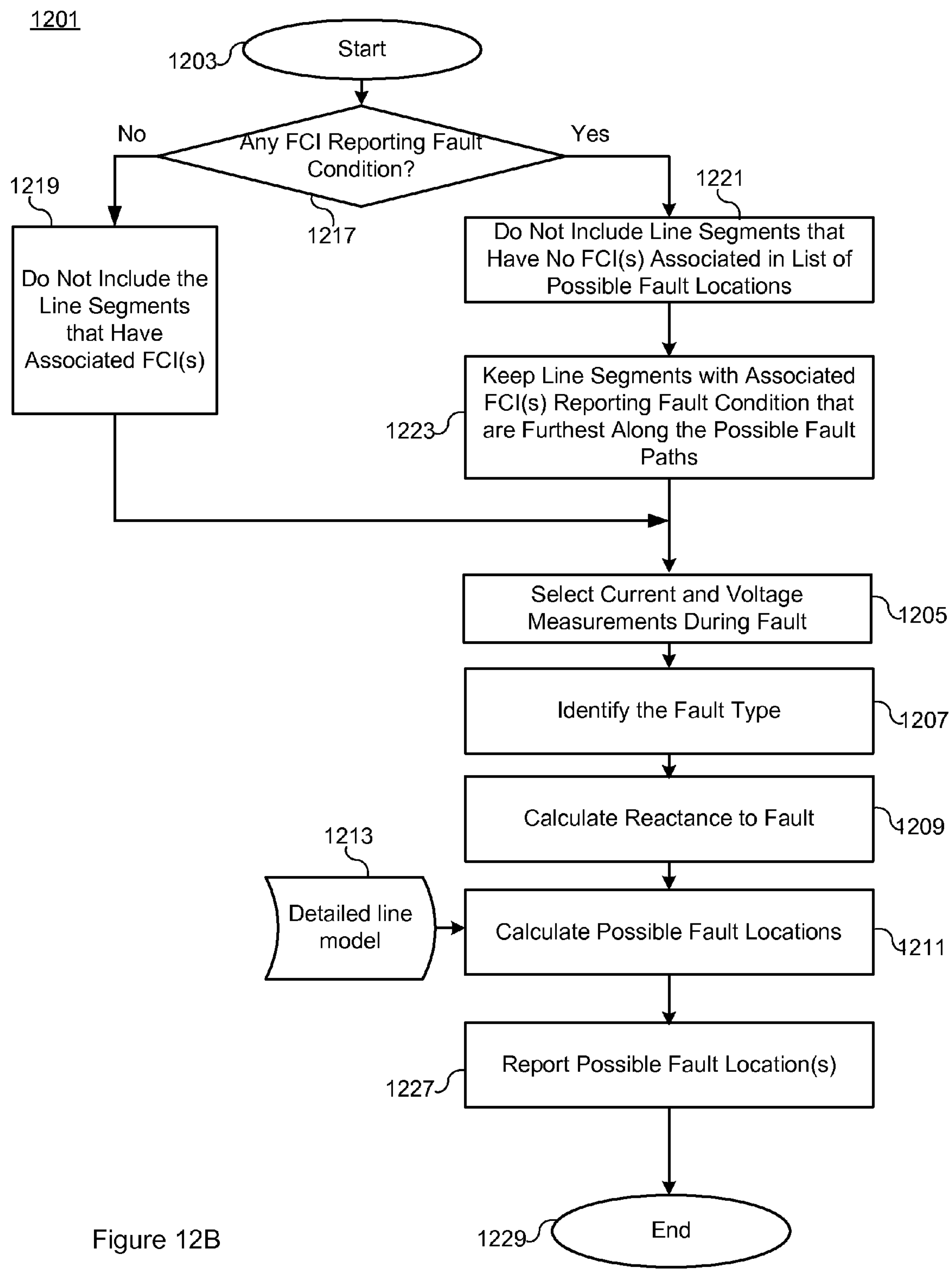
FIG. 12B illustrates a process flow diagram of a method for calculating a location of a fault on an electric power delivery system using an electric power delivery system model, reactance to the fault, and FCI data; and, FIG. 13 illustrates a functional block diagram of a device that may be used to calculate a location of a fault on an electric power delivery system.

FIG. 12B illustrates another arrangement of a similar method as that described in conjunction with FIG. 12A. Method 1201 starts 1203 with determining whether any FCIs report the faulted condition 1217. If not, then the method does not include line segments with associated FCIs in the list of possible fault locations 1219. The method then proceeds to calculating the fault location using electric power delivery system information beginning with selecting the current and voltage measurements during the fault 1205. Otherwise, the method creates a list of possibly faulted segments by first not including any line segments that have no FCIs associated therewith 1221. Further, the list will include each segment with FCIs reporting a faulted condition where the FCI is the furthest along the path to the possible fault location 1223.

With this list of possible fault locations by segment, the method continues to perform the fault location calculations as described previously herein. In detail, the method continues to select current and voltage measurements during the fault to use in its fault location calculations 1205. As above, fault data may be available from multiple IEDs, and the fault locator may select the best fault data. Once the appropriate fault data is selected, the fault locator identifies the fault type 1207. With the fault data and the fault type indication, the method calculates the reactance to the fault 1209, also as described above. The method then calculates the possible fault locations 1211 from the list of possible faulted segments in steps 1221 and 1223. The step of calculating the possible fault locations 1211 may follow any of the methods as described above in conjunction with FIG. 9B, 9C, or 9D to create a list of possible fault locations. The step may include use of the detailed line model 1213, as described above, to narrow down the list of possible fault locations based on the phases involved in the fault and the phases present at each of the calculated possible fault locations, and on line impedance criteria. The method then proceeds to report the possible fault location(s) 1227 and ends 1229.

In one alternative, a fault locator on a system with both IEDs and FCIs may be configured to use the information provided from the IEDs and FCIs in different ways than as described above. For example, the fault locator may be configured to use power system fault data from a particular IED (such as IED 1102 of FIG. 11), and treat data received from any other FCIs and/or IEDs as simply indications that a fault has been detected at that location. That is, data from IED 1104 would be treated as a fault indication. In this case, the IED 1104 may communicate only a flag indicating that the fault has been detected (along with information identifying the particular IED 1104 such as the IED location, serial number, or the like). Further, the electric power delivery system may include FCIs that are capable of detecting and reporting electric power delivery system fault data such as currents, voltages, frequencies, and the like. A fault locator in connection with such FCIs may be configured to treat such data as it would data received from an IED. Accordingly, the data from the FCI electrically closest to the fault may be used to calculate the fault location, and the fault location may be reported as the distance from the FCI electrically closest to the fault. Furthermore, the data from the FCI that is electrically closest to the fault and that gives the best data may be selected for use in the fault location determination.

Further, in using the methods described above, the fault locator may determine which power line sensor (such as an IED or FCI) is closed to the fault, determine that the segment associated therewith is the faulted segment, and refine the location of the fault along the particular segment using the voltage and current measurements from the particular power line sensor.

Figure 13:
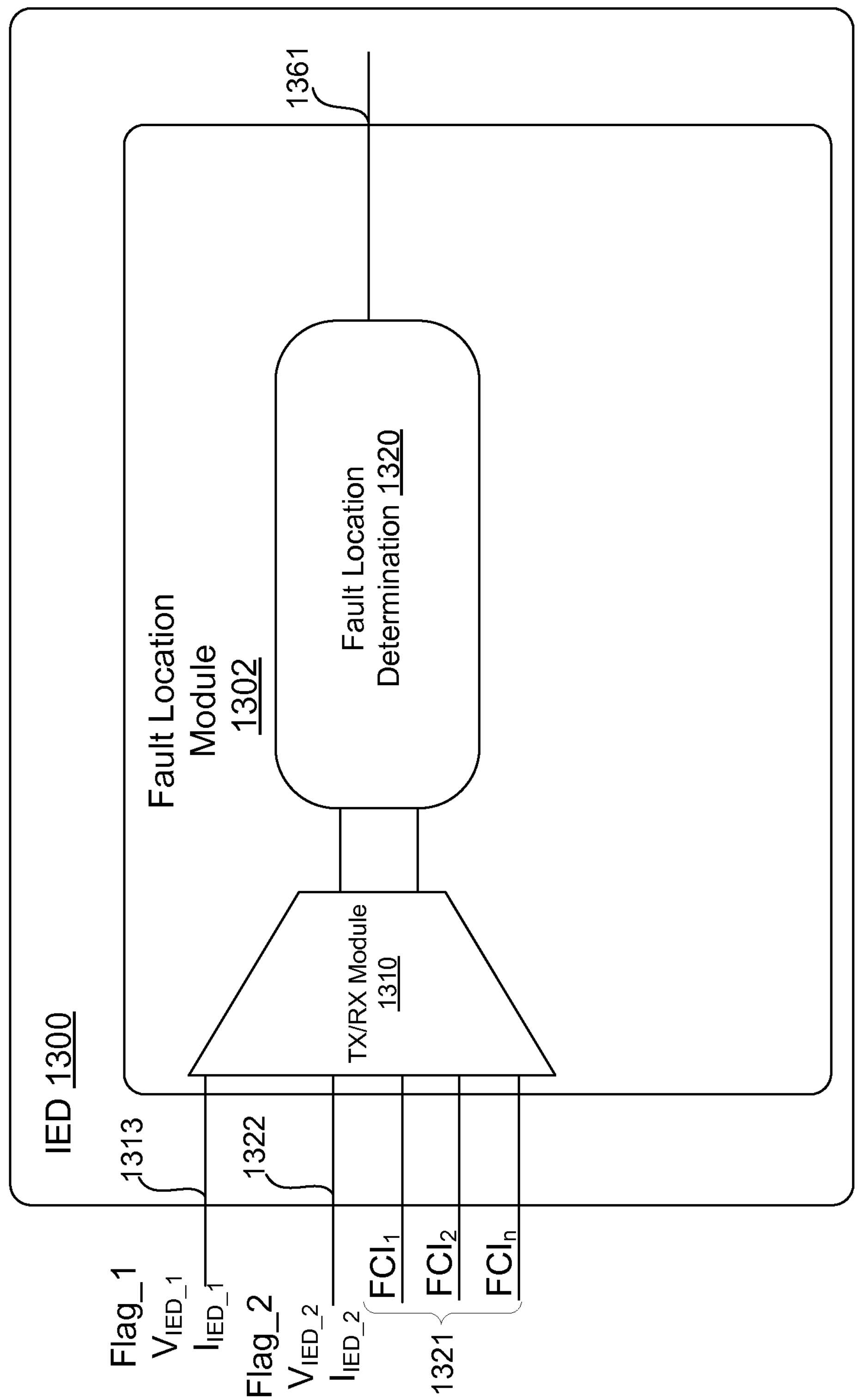

FIG. 13 illustrates a functional block diagram of an IED that may be used to determine the location of the fault according to the disclosure herein. As discussed above, the IED that includes the fault location module 1302 may be an IED in direct communication with the electric power delivery system (such as a protective relay, a voltage regulator controller, a capacitor bank controller, a phasor measurement unit, or the like), or an IED that receives information from an IED in direct communication with the electric power delivery system (such as a communications processor, an automation controller, a vector processor, an industrial computer, or the like). The IED 1300 includes several inputs, including the currents and voltages 1313 obtained from a first IED at a first local location of the power system. The IED 1300 may further receive an indication of a fault condition (such as a fault flag, an indication in an event report, change in state of an output contact or a communications bit, or the like) from an IED 1313. The IED 1300 may also include voltage and current inputs as well as a fault flag from a second IED 1322, or more IEDs at different locations on the electric power delivery system, as well as from FCIs 1321 in communication with the electric power delivery system.

IED 1300 includes a transmit and/or receive module 1310 in communication with the various inputs 1313, 1322, and 1321 for receiving the flags and/or electric power delivery system information, and transmitting such information to the fault location determination module 1320. The transmit and/or receive module 1310 may further be capable of transmitting communications such as requests, commands, or the like from the fault location determination module 1320 to the various devices and FCIs in communication therewith. For example, once the fault location determination module 1302 receives a flag indicating a faulted condition, it may request fault information from the various IEDs and FCIs in communication therewith. As previously mentioned, however, the IEDs and FCIs may be configured to automatically transmit electric power delivery system fault information automatically to the fault locator. The fault locator may be configured to automatically request fault information upon receipt of an indication of a faulted condition, or may be configured to require user input to gather such information.

IED 1300 includes a fault location module 1302 that includes instructions for calculating the location of the fault, stored in computer-readable media, and executed using a processor, FPGA, ASIC, or the like. The fault location module 1302 may include a transmit/receive module 1310 for receiving the voltages, currents, and fault indication flags from the various sources. In some embodiments, the IED 1300 may be in direct communication with the electric power delivery system, and certain of the measurements may come directly therefrom. These measurements are used by the fault location module. In other embodiments, the IED 1300 is not in direct communication with the electric power delivery system, and may receive transmissions of the information from various other IEDs and FCIs. The transmit/receive module 1310 may also receive power system information and indications from power line monitors such as FCIs through the FCI input 1321. The fault location module 1302 may select which fault information to use as discussed herein, and transmit this information to the fault location determination module 1320. Power system information and power line sensor communications are inputs to the fault location determination module 1320 which may operate any of the methods described herein to calculate the location of the fault (or list of possible locations).

Once the fault location determination module 1320 has calculated the location list of possible fault locations, it communicates the list 1361. The signal 1361 may be sent to further protection modules of the IED, to a remote IED, to a Supervisory Control and Data Acquisition (SCADA) system, to an alarm contact, or the like. In one embodiment, the fault location information may be stored and retrieved, or sent (via, for example, email, telephone, instant messaging, or the like) to utility personnel who can then act to restore service and/or repair the faulted conductor(s).

Although FIG. 13 illustrates the fault location module operating on an IED operational for protection of an electric power delivery system, the fault location module may operate on any processor, FPGA, ASIC or the like with access to the required fault and power system information. Indeed, a processor, FPGA, ASIC or the like to which voltage and current information from the power system is communicated, and with access to the electric power system line segment parameters discussed above may operate the fault location module to determine the location of the fault. As described herein, access to FCI information, remote voltage and current information, and the like may be used by the processor, FPGA, ASIC, or the like to determine fault location. Computer instructions for the fault location module and the distance function may be stored in computer-readable media such as memory. The memory may be part of the processor or a separate memory in communication with the processor.

Accordingly, the IED of FIG. 13 may be a stand-alone device configured to receive information from IED(s) and/or FCI(s) in communication with the electric power delivery system, and calculate a fault location therefrom.

Further, although the above embodiments are described in terms of using a reactance value, other values may be used to calculate the location of the fault. For example, instead of reactance, an impedance value may be used. That is, the systems and methods herein may calculate positive-sequence or total sequence impedance the fault, and compare that with the impedances of segments of the electric power delivery system similar to the ways that positive-sequence and total sequence reactances are used as described above.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed is:

1. A system for determining a location of a fault in a radial electric power delivery system with at least two branches, comprising:

a first device in electrical communication with the radial electric power delivery system for obtaining power system voltage and current information therefrom and determining whether a fault condition exists thereon; and, a fault locator in communication with the first device, including:

a receive module for receiving:

an indication from the first device of a phase-to-phase fault condition on the radial electric power delivery system; and, radial electric power delivery system data including the voltage and current information or a value calculated therefrom from the first device;

a fault location determination module for determining possible fault locations and creating a list of the possible fault locations using:

the radial electric power delivery system data from the first device;

physical parameters of the radial electric power delivery system; and, a calculated reactance to the fault calculated without using positive-sequence current.

2. The system of claim 1, wherein the calculated reactance to the fault is calculated using:

$$X1_{calc} = Im\left(\frac{V_2 - V_1}{2 * I_2}\right)$$

where:

$X1_{calc}$ comprises the calculated reactance to the fault;

$V_2$ comprises a negative-sequence voltage;

$V_1$ comprises a positive-sequence voltage; and, $I_2$ comprises a negative-sequence current.

3. The system of claim 2, wherein the radial electric power delivery system comprises segments, and the physical parameters of the radial electric power delivery system comprise physical parameters for each segment.

4. The system of claim 3, wherein the physical parameters comprise a reactance and a length for each segment, and the fault location determination module uses the calculated reactance to the fault calculated from the radial electric power delivery system voltage and current information for determining the possible fault locations.

5. The system of claim 3, wherein the physical parameters comprises topology of the radial electric power delivery system.

6. The system of claim 5, wherein the topology comprises for each segment a from node and a to node.

7. The system of claim 3, wherein the physical parameters comprise an indication of the electrical phases present on each segment.

8. The system of claim 3, wherein the fault location determination module comprises a table of possible fault locations for a number of reactances along the radial electric power delivery system.

9. The system of claim 8, wherein the fault location determination module compares the calculated reactance to the fault against the table to produce a list of possible fault locations.

10. The system of claim 9, wherein the radial electric power delivery system comprises segments, the physical parameters of the radial electric power delivery system comprise physical parameters for each segment, and for each of the possible fault locations on the list of possible fault locations, the fault location determination module calculates a length along the corresponding segment to the possible fault location using a reactance to the end of the segment, the calculated reactance to the fault, and the length of the segment.

11. The system of claim 10, wherein the length along the segment to the possible fault location is calculated using a linear relationship among the length of the segment, reactance of the segment, the reactance to the end of the segment, and the calculated reactance to the fault.

12. The system of claim 2, wherein the radial electric power delivery system comprises segments, the physical parameters of the radial electric power delivery system comprise physical parameters for each segment, the fault location determination module calculates possible fault locations using an iterative method along each branch.

13. The system of claim 7, wherein the fault location determination module removes possible fault locations from the list of possible fault locations for segments lacking an electrical phase involved in the fault.

14. The system of claim 5, wherein the fault location determination module removes possible fault locations from the list of possible fault locations for segments disconnected from the radial electric power delivery system as indicated in the topology.

15. The system of claim 14, wherein disconnected segments are indicated by an open switch or an open circuit breaker.

16. The system of claim 5, wherein the topology comprises a topology at a time before the phase-to-phase fault condition.

17. A method for determining a location of a fault having a fault type in an radial electric power delivery system, comprising a first intelligent electronic device in electrical communication with the radial electric power delivery system, the method comprising:

obtaining, at the first intelligent electronic device radial electric power delivery system voltage and current information from the radial electric power delivery system;

determining, at the first intelligent electronic device a phase-to-phase fault condition on the radial electric power delivery system;

communicating the phase-to-phase fault condition and radial electric power delivery system data including the voltage and current information or a value calculated therefrom from the first intelligent electronic device to a fault locator;

determining using the fault locator a possible fault location on the radial electric power delivery system and creating, using the fault locator, a list of the possible fault locations using:

the radial electric power delivery system data;

physical parameters of the radial electric power delivery system; and, a calculated reactance to the fault calculated without using positive-sequence current.

18. The method of claim 17, wherein the calculated reactance to the fault is calculated using:

$$X1_{calc} = \mathrm{Im}\left(\frac{V_2 - V_1}{2 * I_2}\right).$$

19. The method of claim 17, further comprising comparing the calculated reactance to a list of possible calculated reactances to determine the possible fault locations.

20. The method of claim 19, wherein the radial electric power delivery system comprises segments, and the method further comprises the step of refining each possible fault location by calculating a distance along a segment to the possible fault location using the calculated reactance and a length of a segment that includes the possible fault location.

21. The method of claim 20, further comprising the step of calculating a reactance to the end of the segment by summing reactances for each segment in series from the first device to the end of the segment that includes the possible fault location.

22. The method of claim 21, wherein the step of refining comprises calculating the distance to the fault along the segment using a linear relationship among the reactance to the end of the segment, the calculated reactance, the length of the segment, and the reactance of the segment.

* * * * *